(12) United States Patent
Adest

(10) Patent No.: US 11,177,768 B2
(45) Date of Patent: Nov. 16, 2021

(54) INTEGRATED PHOTOVOLTAIC PANEL CIRCUITRY

(71) Applicant: Solaredge Technologies Ltd., Herzeliya (IL)

(72) Inventor: Meir Adest, Modiin (IL)

(73) Assignee: Solaredge Technologies Ltd., Herzeliya (IL)

( * ) Notice: Subject to any disclaimer, the term of this patent is extended or adjusted under 35 U.S.C. 154(b) by 134 days.

(21) Appl. No.: 16/113,593

(22) Filed: Aug. 27, 2018

(65) Prior Publication Data

US 2018/0374966 A1 Dec. 27, 2018

Related U.S. Application Data

(62) Division of application No. 13/487,311, filed on Jun. 4, 2012, now Pat. No. 10,115,841.

(51) Int. Cl.
*H02S 40/34* (2014.01)
*H01L 31/04* (2014.01)
(Continued)

(52) U.S. Cl.
CPC ........ *H02S 40/34* (2014.12); *H01L 31/02021* (2013.01); *H01L 31/04* (2013.01);
(Continued)

(58) Field of Classification Search
CPC ......... H01L 31/04; H02S 40/34; H02S 40/36; Y10T 307/707
(Continued)

(56) References Cited

U.S. PATENT DOCUMENTS 2,367,925 A 1/1945 Brown
2,586,804 A 2/1952 Fluke
(Continued)

FOREIGN PATENT DOCUMENTS

AU 2073800 A 9/2000
AU 2005262278 A1 1/2006
(Continued)

OTHER PUBLICATIONS

Jul. 2, 2019—EP 19160798.5—European Search Report.
(Continued)

*Primary Examiner* — Adi Amrany
(74) *Attorney, Agent, or Firm* — Banner & Witcoff, Ltd.

(57) ABSTRACT

A photovoltaic module is presented, which may include a photovoltaic panel and a converter circuit having a primary input connected to the photovoltaic panel and a secondary output galvanically isolated from the primary input. The primary input may be connectible to multiple input terminals within a junction box and at least one of the input terminals may be electrically connected to a ground. The photovoltaic module may include multiple interconnected photovoltaic cells connected electrically to multiple connectors (for example bus-bars). The photovoltaic module may include input terminals operable for connecting to the connectors and an isolated converter circuit. The isolated converter circuit may include a primary input connected to the input terminals and a secondary output galvanically isolated from the primary input.

20 Claims, 8 Drawing Sheets

(51) Int. Cl.
*H02S 40/36* (2014.01)
*H01L 31/02* (2006.01)
*H02J 1/10* (2006.01)

(52) U.S. Cl.
CPC ............ *H02S 40/36* (2014.12); *H02J 1/10* (2013.01); *Y02E 10/50* (2013.01); *Y10T 29/49117* (2015.01)

(58) Field of Classification Search
USPC ................................................ 307/77, 82
See application file for complete search history.

(56) References Cited

U.S. PATENT DOCUMENTS

| | | |
|---|---|---|
| 2,758,219 A | 8/1956 | Miller |
| 2,852,721 A | 9/1958 | Harders et al. |
| 2,958,171 A | 11/1960 | Deckers |
| 3,369,210 A | 2/1968 | Manickella |
| 3,392,326 A | 7/1968 | Lamberton |
| 3,496,029 A | 2/1970 | King et al. |
| 3,566,143 A | 2/1971 | Paine et al. |
| 3,696,286 A | 10/1972 | Ule |
| 3,740,652 A | 6/1973 | Burgener |
| 3,958,136 A | 5/1976 | Schroeder |
| 4,060,757 A | 11/1977 | McMurray |
| 4,101,816 A | 7/1978 | Shepter |
| 4,104,687 A | 8/1978 | Zulaski |
| 4,129,788 A | 12/1978 | Chavannes |
| 4,129,823 A | 12/1978 | van der Pool et al. |
| 4,146,785 A | 3/1979 | Neale |
| 4,161,771 A | 7/1979 | Bates |
| 4,171,861 A | 10/1979 | Hohorst |
| 4,183,079 A | 1/1980 | Wachi |
| 4,257,087 A | 3/1981 | Cuk |
| 4,296,461 A | 10/1981 | Mallory et al. |
| 4,321,581 A | 3/1982 | Tappeiner et al. |
| 4,327,318 A | 4/1982 | Kwon et al. |
| 4,346,341 A | 8/1982 | Blackburn et al. |
| 4,363,040 A | 12/1982 | Inose |
| 4,367,557 A | 1/1983 | Stern et al. |
| 4,375,662 A | 3/1983 | Baker |
| 4,384,321 A | 5/1983 | Rippel |
| 4,404,472 A | 9/1983 | Steigerwald |
| 4,412,142 A | 10/1983 | Ragonese et al. |
| 4,452,867 A | 6/1984 | Conforti |
| 4,453,207 A | 6/1984 | Paul |
| 4,460,232 A | 7/1984 | Sotolongo |
| 4,470,213 A | 9/1984 | Thompson |
| 4,479,175 A | 10/1984 | Gille et al. |
| 4,481,654 A | 11/1984 | Daniels et al. |
| 4,488,136 A | 12/1984 | Hansen et al. |
| 4,526,553 A | 7/1985 | Guerrero |
| 4,533,986 A | 8/1985 | Jones |
| 4,545,997 A | 10/1985 | Wong et al. |
| 4,549,254 A | 10/1985 | Kissel |
| 4,554,502 A | 11/1985 | Rohatyn |
| 4,554,515 A | 11/1985 | Burson et al. |
| 4,580,090 A | 4/1986 | Bailey et al. |
| 4,591,965 A | 5/1986 | Dickerson |
| 4,598,330 A | 7/1986 | Woodworth |
| 4,602,322 A | 7/1986 | Merrick |
| 4,604,567 A | 8/1986 | Chetty |
| 4,611,090 A * | 9/1986 | Catella ............... H01L 31/048 136/251 |
| 4,623,753 A | 11/1986 | Feldman et al. |
| 4,626,983 A | 12/1986 | Harada et al. |
| 4,631,565 A | 12/1986 | Tihanyi |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,649,334 A | 3/1987 | Nakajima |
| 4,652,770 A | 3/1987 | Kumano |
| 4,683,529 A | 7/1987 | Bucher, II |
| 4,685,040 A | 8/1987 | Steigerwald et al. |
| 4,686,617 A | 8/1987 | Colton |
| 4,706,181 A | 11/1987 | Mercer |
| 4,719,553 A | 1/1988 | Hinckley |
| 4,720,667 A | 1/1988 | Lee et al. |
| 4,720,668 A | 1/1988 | Lee et al. |
| 4,736,151 A | 4/1988 | Dishner |
| 4,746,879 A | 5/1988 | Ma et al. |
| 4,772,994 A | 9/1988 | Harada et al. |
| 4,783,728 A | 11/1988 | Hoffman |
| 4,797,803 A | 1/1989 | Carroll |
| 4,819,121 A | 4/1989 | Saito et al. |
| RE33,057 E | 9/1989 | Clegg et al. |
| 4,864,213 A | 9/1989 | Kido |
| 4,868,379 A | 9/1989 | West |
| 4,873,480 A | 10/1989 | Lafferty |
| 4,888,063 A | 12/1989 | Powell |
| 4,888,702 A | 12/1989 | Gerken et al. |
| 4,899,246 A | 2/1990 | Tripodi |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,945,255 A | 7/1990 | Suzuki et al. |
| 4,951,117 A | 8/1990 | Kasai |
| 4,978,870 A | 12/1990 | Chen et al. |
| 4,987,360 A | 1/1991 | Thompson |
| 5,001,415 A | 3/1991 | Watkinson |
| 5,027,051 A | 6/1991 | Lafferty |
| 5,027,059 A | 6/1991 | de Montgolfier et al. |
| 5,045,988 A | 9/1991 | Gritter et al. |
| 5,081,558 A | 1/1992 | Mahler |
| 5,097,196 A | 3/1992 | Schoneman |
| 5,138,422 A | 8/1992 | Fujii et al. |
| 5,143,556 A | 9/1992 | Matlin |
| 5,144,222 A | 9/1992 | Herbert |
| 5,155,670 A | 10/1992 | Brian |
| 5,191,519 A | 3/1993 | Kawakami |
| 5,196,781 A | 3/1993 | Jamieson et al. |
| 5,210,519 A | 5/1993 | Moore |
| 5,235,266 A | 8/1993 | Schaffrin |
| 5,237,194 A | 8/1993 | Takahashi |
| 5,268,832 A | 12/1993 | Kandatsu |
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,391,235 A | 2/1995 | Inoue |
| 5,402,060 A | 3/1995 | Erisman |
| 5,404,059 A | 4/1995 | Loffler |
| 5,412,558 A | 5/1995 | Sakurai et al. |
| 5,413,313 A | 5/1995 | Mutterlein et al. |
| 5,428,286 A | 6/1995 | Kha |
| 5,446,645 A | 8/1995 | Shirahama et al. |
| 5,460,546 A | 10/1995 | Kunishi et al. |
| 5,472,614 A | 12/1995 | Rossi |
| 5,493,154 A | 2/1996 | Smith et al. |
| 5,497,289 A | 3/1996 | Sugishima et al. |
| 5,504,415 A | 4/1996 | Podrazhansky et al. |
| 5,504,418 A | 4/1996 | Ashley |
| 5,504,449 A | 4/1996 | Prentice |
| 5,513,075 A | 4/1996 | Capper et al. |
| 5,517,378 A | 5/1996 | Asplund et al. |
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,566,022 A | 10/1996 | Segev |
| 5,576,941 A | 11/1996 | Nguyen et al. |
| 5,580,395 A | 12/1996 | Yoshioka et al. |
| 5,585,749 A | 12/1996 | Pace et al. |

(56) References Cited

U.S. PATENT DOCUMENTS

| | | |
|---|---|---|
| 5,604,430 A | 2/1997 | Decker et al. |
| 5,616,913 A | 4/1997 | Litterst |
| 5,631,534 A | 5/1997 | Lewis |
| 5,636,107 A | 6/1997 | Lu et al. |
| 5,644,212 A | 7/1997 | Takahashi |
| 5,644,219 A | 7/1997 | Kurokawa |
| 5,646,501 A | 7/1997 | Fishman et al. |
| 5,648,731 A | 7/1997 | Decker et al. |
| 5,654,740 A | 8/1997 | Schulha |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,696,439 A | 12/1997 | Presti et al. |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,505 A | 3/1998 | Yamada et al. |
| 5,726,615 A | 3/1998 | Bloom |
| 5,731,603 A | 3/1998 | Nakagawa et al. |
| 5,734,259 A | 3/1998 | Sisson et al. |
| 5,734,565 A | 3/1998 | Mueller et al. |
| 5,747,967 A | 5/1998 | Muljadi et al. |
| 5,751,120 A | 5/1998 | Zeitler et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spee et al. |
| 5,801,519 A | 9/1998 | Midya et al. |
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilpert |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Copple |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,955,885 A | 9/1999 | Kurokami et al. |
| 5,959,438 A | 9/1999 | Jovanovic et al. |
| 5,961,739 A | 10/1999 | Osborne |
| 5,963,010 A | 10/1999 | Hayashi et al. |
| 5,963,078 A | 10/1999 | Wallace |
| 5,982,253 A | 11/1999 | Perrin et al. |
| 5,986,909 A | 11/1999 | Hammond et al. |
| 5,990,659 A | 11/1999 | Frannhagen |
| 6,002,290 A | 12/1999 | Avery et al. |
| 6,002,603 A | 12/1999 | Carver |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,091,329 A | 7/2000 | Newman |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,219,623 B1 | 4/2001 | Wills |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 | 7/2001 | Yamawaki |
| 6,274,804 B1 | 8/2001 | Psyk et al. |
| 6,275,016 B1 | 8/2001 | Ivanov |
| 6,281,485 B1 | 8/2001 | Siri |
| 6,285,572 B1 | 9/2001 | Onizuka et al. |
| 6,292,379 B1 | 9/2001 | Edevold et al. |
| 6,297,621 B1 | 10/2001 | Hui et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |
| 6,331,670 B2 | 12/2001 | Takehara et al. |
| 6,339,538 B1 * | 1/2002 | Handleman ............... G05F 1/67 |
| | | 136/293 |
| 6,344,612 B1 | 2/2002 | Kuwahara et al. |
| 6,346,451 B1 | 2/2002 | Simpson et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,396,239 B1 | 5/2002 | Benn et al. |
| 6,400,579 B2 | 6/2002 | Cuk |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |
| 6,448,489 B2 | 9/2002 | Kimura et al. |
| 6,452,814 B1 | 9/2002 | Wittenbreder |
| 6,465,910 B2 | 10/2002 | Young et al. |
| 6,465,931 B2 | 10/2002 | Knowles et al. |
| 6,469,919 B1 | 10/2002 | Bennett |
| 6,472,254 B2 | 10/2002 | Cantarini et al. |
| 6,483,203 B1 | 11/2002 | McCormack |
| 6,493,246 B2 | 12/2002 | Suzui et al. |
| 6,501,362 B1 | 12/2002 | Hoffman et al. |
| 6,507,176 B2 | 1/2003 | Wittenbreder, Jr. |
| 6,509,712 B1 | 1/2003 | Landis |
| 6,512,444 B1 | 1/2003 | Morris, Jr. et al. |
| 6,515,215 B1 | 2/2003 | Mimura |

(56) References Cited

U.S. PATENT DOCUMENTS

| | | |
|---|---|---|
| 6,519,165 B2 | 2/2003 | Koike |
| 6,528,977 B2 | 3/2003 | Arakawa |
| 6,531,848 B1 | 3/2003 | Chitsazan et al. |
| 6,545,211 B1 | 4/2003 | Mimura |
| 6,548,205 B2 | 4/2003 | Leung et al. |
| 6,560,131 B1 | 5/2003 | vonBrethorst |
| 6,587,051 B2 | 7/2003 | Takehara et al. |
| 6,590,793 B1 | 7/2003 | Nagao et al. |
| 6,590,794 B1 | 7/2003 | Carter |
| 6,593,520 B2 | 7/2003 | Kondo et al. |
| 6,593,521 B2 | 7/2003 | Kobayashi |
| 6,600,100 B2 | 7/2003 | Ho et al. |
| 6,603,672 B1 | 8/2003 | Deng et al. |
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,636,431 B2 | 10/2003 | Seki et al. |
| 6,650,031 B1 | 11/2003 | Goldack |
| 6,650,560 B2 | 11/2003 | MacDonald et al. |
| 6,653,549 B2 | 11/2003 | Matsushita et al. |
| 6,655,987 B2 | 12/2003 | Higashikozono et al. |
| 6,657,419 B2 | 12/2003 | Renyolds |
| 6,664,762 B2 | 12/2003 | Kutkut |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,327 B2 | 2/2004 | Priefert et al. |
| 6,693,781 B1 | 2/2004 | Kroker |
| 6,709,291 B1 | 3/2004 | Wallace et al. |
| 6,724,593 B1 | 4/2004 | Smith |
| 6,731,136 B2 | 5/2004 | Knee |
| 6,738,692 B2 | 5/2004 | Schienbein et al. |
| 6,744,643 B2 | 6/2004 | Luo et al. |
| 6,750,391 B2 | 6/2004 | Bower et al. |
| 6,765,315 B2 | 7/2004 | Hammerstrom et al. |
| 6,768,047 B2 | 7/2004 | Chang et al. |
| 6,768,180 B2 | 7/2004 | Salama et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,800,964 B2 | 10/2004 | Beck |
| 6,801,442 B2 | 10/2004 | Suzui et al. |
| 6,807,069 B2 | 10/2004 | Nieminen et al. |
| 6,809,942 B2 | 10/2004 | Madenokouji et al. |
| 6,810,339 B2 | 10/2004 | Wills |
| 6,812,396 B2 | 11/2004 | Makita et al. |
| 6,828,503 B2 | 12/2004 | Yoshikawa et al. |
| 6,828,901 B2 | 12/2004 | Birchfield et al. |
| 6,837,739 B2 | 1/2005 | Gorringe et al. |
| 6,838,611 B2 | 1/2005 | Kondo et al. |
| 6,838,856 B2 | 1/2005 | Raichle |
| 6,842,354 B1 | 1/2005 | Tallam et al. |
| 6,844,739 B2 | 1/2005 | Kasai et al. |
| 6,850,074 B2 | 2/2005 | Adams et al. |
| 6,856,102 B1 | 2/2005 | Lin et al. |
| 6,882,131 B1 | 4/2005 | Takada et al. |
| 6,888,728 B2 | 5/2005 | Takagi et al. |
| 6,894,911 B2 | 5/2005 | Telefus et al. |
| 6,897,370 B2 | 5/2005 | Kondo et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,933,714 B2 | 8/2005 | Fasshauer et al. |
| 6,936,995 B2 | 8/2005 | Kapsokavathis et al. |
| 6,940,735 B2 | 9/2005 | Deng et al. |
| 6,949,843 B2 | 9/2005 | Dubovsky |
| 6,950,323 B2 | 9/2005 | Achleitner et al. |
| 6,963,147 B2 | 11/2005 | Kurokami et al. |
| 6,966,184 B2 | 11/2005 | Toyomura et al. |
| 6,980,783 B2 | 12/2005 | Liu et al. |
| 6,984,967 B2 | 1/2006 | Notman |
| 6,984,970 B2 | 1/2006 | Capel |
| 6,987,444 B2 | 1/2006 | Bub et al. |
| 6,996,741 B1 | 2/2006 | Pittelkow et al. |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,042,195 B2 | 5/2006 | Tsunetsugu et al. |
| 7,045,991 B2 | 5/2006 | Nakamura et al. |
| 7,046,531 B2 | 5/2006 | Zocchi et al. |
| 7,053,506 B2 | 5/2006 | Alonso et al. |
| 7,061,211 B2 | 6/2006 | Satoh et al. |
| 7,061,214 B2 | 6/2006 | Mayega et al. |
| 7,064,967 B2 | 6/2006 | Ichinose et al. |
| 7,068,017 B2 | 6/2006 | Willner et al. |
| 7,072,194 B2 | 7/2006 | Nayar et al. |
| 7,078,883 B2 | 7/2006 | Chapman et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,142,997 B1 | 11/2006 | Widner |
| 7,148,669 B2 | 12/2006 | Maksimovic et al. |
| 7,150,938 B2 | 12/2006 | Munshi et al. |
| 7,158,359 B2 | 1/2007 | Bertele et al. |
| 7,158,395 B2 | 1/2007 | Deng et al. |
| 7,161,082 B2 | 1/2007 | Matsushita et al. |
| 7,174,973 B1 | 2/2007 | Lysaght |
| 7,183,667 B2 | 2/2007 | Colby et al. |
| 7,193,872 B2 | 3/2007 | Siri |
| 7,202,653 B2 | 4/2007 | Pai |
| 7,208,674 B2 | 4/2007 | Aylaian |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,259,474 B2 | 8/2007 | Blanc |
| 7,262,979 B2 | 8/2007 | Wai et al. |
| 7,276,886 B2 | 10/2007 | Kinder et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,291,036 B1 | 11/2007 | Daily et al. |
| RE39,976 E | 1/2008 | Schiff et al. |
| 7,315,052 B2 | 1/2008 | Alter |
| 7,319,313 B2 | 1/2008 | Dickerson et al. |
| 7,324,361 B2 | 1/2008 | Siri |
| 7,336,004 B2 | 2/2008 | Lai |
| 7,336,056 B1 | 2/2008 | Dening |
| 7,339,287 B2 | 3/2008 | Jepsen et al. |
| 7,348,802 B2 | 3/2008 | Kasanyal et al. |
| 7,352,154 B2 | 4/2008 | Cook |
| 7,361,952 B2 | 4/2008 | Miura et al. |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,388,348 B2 | 6/2008 | Mattichak |
| 7,394,237 B2 | 7/2008 | Chou et al. |
| 7,405,117 B2 | 7/2008 | Zuniga et al. |
| 7,414,870 B2 | 8/2008 | Rottger et al. |
| 7,420,354 B2 | 9/2008 | Cutler |
| 7,420,815 B2 | 9/2008 | Love |
| 7,432,691 B2 | 10/2008 | Cutler |
| 7,435,134 B2 | 10/2008 | Lenox |
| 7,435,897 B2 | 10/2008 | Russell |
| 7,443,052 B2 | 10/2008 | Wendt et al. |
| 7,443,152 B2 | 10/2008 | Utsunomiya |
| 7,450,401 B2 | 11/2008 | Iida |
| 7,456,510 B2 | 11/2008 | Ito et al. |
| 7,456,523 B2 | 11/2008 | Kobayashi |
| 7,463,500 B2 | 12/2008 | West |
| 7,466,566 B2 | 12/2008 | Fukumoto |
| 7,471,014 B2 | 12/2008 | Lum et al. |
| 7,471,524 B1 | 12/2008 | Batarseh et al. |
| 7,479,774 B2 | 1/2009 | Wai et al. |
| 7,482,238 B2 | 1/2009 | Sung |

(56) References Cited

U.S. PATENT DOCUMENTS

| | | |
|---|---|---|
| 7,485,987 B2 | 2/2009 | Mori et al. |
| 7,495,419 B1 | 2/2009 | Ju |
| 7,504,811 B2 | 3/2009 | Watanabe et al. |
| 7,518,346 B2 | 4/2009 | Prexl et al. |
| 7,538,451 B2 | 5/2009 | Nomoto |
| 7,560,915 B2 | 7/2009 | Ito et al. |
| 7,589,437 B2 | 9/2009 | Henne et al. |
| 7,595,616 B2 | 9/2009 | Prexl et al. |
| 7,596,008 B2 | 9/2009 | Iwata et al. |
| 7,599,200 B2 | 10/2009 | Tomonaga |
| 7,600,349 B2 | 10/2009 | Liebendorfer |
| 7,602,080 B1 | 10/2009 | Hadar et al. |
| 7,602,626 B2 | 10/2009 | Iwata et al. |
| 7,605,498 B2 | 10/2009 | Ledenev et al. |
| 7,612,283 B2 | 11/2009 | Toyomura et al. |
| 7,615,981 B2 | 11/2009 | Wong et al. |
| 7,626,834 B2 | 12/2009 | Chisenga et al. |
| 7,646,116 B2 | 1/2010 | Batarseh et al. |
| 7,649,434 B2 | 1/2010 | Xu et al. |
| 7,701,083 B2 | 4/2010 | Savage |
| 7,709,727 B2 | 5/2010 | Roehrig et al. |
| 7,719,140 B2 | 5/2010 | Ledenev et al. |
| 7,723,865 B2 | 5/2010 | Kitanaka |
| 7,733,069 B2 | 6/2010 | Toyomura et al. |
| 7,748,175 B2 | 7/2010 | Liebendorfer |
| 7,759,575 B2 | 7/2010 | Jones et al. |
| 7,763,807 B2 | 7/2010 | Richter |
| 7,772,716 B2 | 8/2010 | Shaver, II et al. |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,807,919 B2 | 10/2010 | Powell et al. |
| 7,808,125 B1 | 10/2010 | Sachdeva et al. |
| 7,812,592 B2 | 10/2010 | Prior et al. |
| 7,812,701 B2 | 10/2010 | Lee et al. |
| 7,821,225 B2 | 10/2010 | Chou et al. |
| 7,824,189 B1 | 11/2010 | Lauermann et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,883,808 B2 | 2/2011 | Norimatsu et al. |
| 7,884,278 B2 | 2/2011 | Powell et al. |
| 7,893,346 B2 | 2/2011 | Nachamkin et al. |
| 7,898,112 B2 | 3/2011 | Powell et al. |
| 7,900,361 B2 | 3/2011 | Adest et al. |
| 7,906,007 B2 | 3/2011 | Gibson et al. |
| 7,906,870 B2 | 3/2011 | Ohm |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 7,969,133 B2 | 6/2011 | Zhang et al. |
| 8,003,885 B2 | 8/2011 | Richter et al. |
| 8,004,113 B2 | 8/2011 | Sander et al. |
| 8,004,116 B2 | 8/2011 | Ledenev et al. |
| 8,004,117 B2 | 8/2011 | Adest et al. |
| 8,004,866 B2 | 8/2011 | Bucella et al. |
| 8,013,472 B2 | 9/2011 | Adest et al. |
| 8,018,748 B2 | 9/2011 | Leonard |
| 8,035,249 B2 | 10/2011 | Shaver, II et al. |
| 8,039,730 B2 | 10/2011 | Hadar et al. |
| 8,049,363 B2 | 11/2011 | McLean et al. |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,080,986 B2 | 12/2011 | Lai et al. |
| 8,089,780 B2 | 1/2012 | Mochikawa et al. |
| 8,089,785 B2 * | 1/2012 | Rodriguez .......... H02M 7/4807 363/35 |
| 8,090,548 B2 | 1/2012 | Abdennadher et al. |
| 8,093,756 B2 | 1/2012 | Porter et al. |
| 8,093,757 B2 | 1/2012 | Wolfs |
| 8,097,818 B2 | 1/2012 | Gerull et al. |
| 8,098,055 B2 | 1/2012 | Avrutsky et al. |
| 8,102,074 B2 | 1/2012 | Hadar et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,631 B2 | 3/2012 | Allen et al. |
| 8,138,914 B2 | 3/2012 | Wong et al. |
| 8,139,335 B2 | 3/2012 | Quardt et al. |
| 8,139,382 B2 | 3/2012 | Zhang et al. |
| 8,148,849 B2 | 4/2012 | Zanarini et al. |
| 8,158,877 B2 | 4/2012 | Klein et al. |
| 8,169,252 B2 | 5/2012 | Fahrenbruch et al. |
| 8,179,147 B2 | 5/2012 | Dargatz et al. |
| 8,184,460 B2 | 5/2012 | O'Brien et al. |
| 8,188,610 B2 | 5/2012 | Scholte-Wassink |
| 8,204,709 B2 | 6/2012 | Presher, Jr. et al. |
| 8,212,408 B2 | 7/2012 | Fishman |
| 8,212,409 B2 | 7/2012 | Bettenwort et al. |
| 8,248,804 B2 | 8/2012 | Han et al. |
| 8,271,599 B2 | 9/2012 | Eizips et al. |
| 8,274,172 B2 | 9/2012 | Hadar et al. |
| 8,279,644 B2 | 10/2012 | Zhang et al. |
| 8,284,574 B2 * | 10/2012 | Chapman .............. H02M 7/537 363/132 |
| 8,289,183 B1 | 10/2012 | Foss |
| 8,289,742 B2 | 10/2012 | Adest et al. |
| 8,294,451 B2 | 10/2012 | Hasenfus |
| 8,304,932 B2 | 11/2012 | Ledenev et al. |
| 8,310,101 B2 | 11/2012 | Amaratunga et al. |
| 8,310,102 B2 | 11/2012 | Raju |
| 8,314,375 B2 | 11/2012 | Arditi et al. |
| 8,324,921 B2 | 12/2012 | Adest et al. |
| 8,325,059 B2 | 12/2012 | Rozenboim |
| 8,344,548 B2 | 1/2013 | Stern |
| 8,369,113 B2 | 2/2013 | Rodriguez |
| 8,378,656 B2 | 2/2013 | de Rooij et al. |
| 8,379,418 B2 | 2/2013 | Falk |
| 8,391,031 B2 | 3/2013 | Garrity |
| 8,391,032 B2 | 3/2013 | Garrity et al. |
| 8,395,366 B2 | 3/2013 | Uno |
| 8,405,248 B2 | 3/2013 | Mumtaz et al. |
| 8,405,349 B2 | 3/2013 | Kikinis et al. |
| 8,405,367 B2 | 3/2013 | Chisenga et al. |
| 8,410,359 B2 | 4/2013 | Richter |
| 8,410,889 B2 | 4/2013 | Garrity et al. |
| 8,410,950 B2 | 4/2013 | Takehara et al. |
| 8,415,552 B2 | 4/2013 | Hadar et al. |
| 8,415,937 B2 | 4/2013 | Hester |
| 8,427,009 B2 | 4/2013 | Shaver, II et al. |
| 8,436,592 B2 | 5/2013 | Saitoh |
| 8,461,809 B2 | 6/2013 | Rodriguez |
| 8,466,789 B2 | 6/2013 | Muhlberger et al. |
| 8,472,220 B2 | 6/2013 | Garrity et al. |
| 8,473,250 B2 | 6/2013 | Adest et al. |
| 8,509,032 B2 | 8/2013 | Rakib |
| 8,526,205 B2 | 9/2013 | Garrity |
| 8,531,055 B2 | 9/2013 | Adest et al. |
| 8,542,512 B2 | 9/2013 | Garrity |
| 8,570,017 B2 | 10/2013 | Perichon et al. |
| 8,581,441 B2 | 11/2013 | Rotzoll et al. |
| 8,587,151 B2 | 11/2013 | Adest et al. |
| 8,618,692 B2 | 12/2013 | Adest et al. |
| 8,624,443 B2 | 1/2014 | Mumtaz |
| 8,653,689 B2 | 2/2014 | Rozenboim |
| 8,669,675 B2 | 3/2014 | Capp et al. |
| 8,670,255 B2 | 3/2014 | Gong et al. |
| 8,674,548 B2 | 3/2014 | Mumtaz |
| 8,674,668 B2 | 3/2014 | Chisenga et al. |
| 8,686,333 B2 | 4/2014 | Arditi et al. |
| 8,710,351 B2 | 4/2014 | Robbins |
| 8,751,053 B2 | 6/2014 | Hadar et al. |

(56) References Cited

U.S. PATENT DOCUMENTS

| | | |
|---|---|---|
| 8,773,236 B2 | 7/2014 | Makhota et al. |
| 8,791,598 B2 | 7/2014 | Jain |
| 8,809,699 B2 | 8/2014 | Funk |
| 8,811,047 B2 | 8/2014 | Rodriguez |
| 8,816,535 B2 | 8/2014 | Adest et al. |
| 8,823,212 B2 | 9/2014 | Garrity et al. |
| 8,823,218 B2 | 9/2014 | Hadar et al. |
| 8,823,342 B2 | 9/2014 | Williams |
| 8,835,748 B2 | 9/2014 | Frolov et al. |
| 8,841,916 B2 | 9/2014 | Avrutsky |
| 8,853,886 B2 | 10/2014 | Avrutsky et al. |
| 8,854,193 B2 | 10/2014 | Makhota et al. |
| 8,859,884 B2 | 10/2014 | Dunton et al. |
| 8,860,241 B2 | 10/2014 | Hadar et al. |
| 8,860,246 B2 | 10/2014 | Hadar et al. |
| 8,878,563 B2 | 11/2014 | Robbins |
| 8,917,156 B2 | 12/2014 | Garrity et al. |
| 8,922,061 B2 | 12/2014 | Arditi |
| 8,933,321 B2 | 1/2015 | Hadar et al. |
| 8,934,269 B2 | 1/2015 | Garrity |
| 8,963,375 B2 | 2/2015 | DeGraaff |
| 8,963,378 B1 | 2/2015 | Fornage et al. |
| 8,972,765 B1 | 3/2015 | Krolak et al. |
| 9,000,714 B2* | 4/2015 | Mun .................. H01L 31/05 320/101 |
| 9,130,401 B2 | 9/2015 | Adest et al. |
| 9,257,848 B2 | 2/2016 | Coccia et al. |
| 9,291,696 B2 | 3/2016 | Adest et al. |
| 9,401,664 B2* | 7/2016 | Perreault .............. H02M 7/497 |
| 9,407,161 B2 | 8/2016 | Adest et al. |
| 9,660,527 B2 | 5/2017 | Glovinski |
| 2001/0000957 A1 | 5/2001 | Birchfield et al. |
| 2001/0023703 A1 | 9/2001 | Kondo et al. |
| 2001/0032664 A1 | 10/2001 | Takehara et al. |
| 2001/0034982 A1 | 11/2001 | Nagao et al. |
| 2001/0035180 A1 | 11/2001 | Kimura et al. |
| 2001/0048605 A1 | 12/2001 | Kurokami et al. |
| 2001/0050102 A1 | 12/2001 | Matsumi et al. |
| 2001/0054881 A1 | 12/2001 | Watanabe |
| 2002/0002040 A1 | 1/2002 | Kline et al. |
| 2002/0014262 A1 | 2/2002 | Matsushita et al. |
| 2002/0017900 A1* | 2/2002 | Takeda .................. H02S 20/23 136/244 |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0047693 A1 | 4/2002 | Chang |
| 2002/0056089 A1 | 5/2002 | Houston |
| 2002/0063552 A1 | 5/2002 | Arakawa |
| 2002/0063625 A1 | 5/2002 | Takehara et al. |
| 2002/0078991 A1 | 6/2002 | Nagao et al. |
| 2002/0080027 A1 | 6/2002 | Conley |
| 2002/0085397 A1 | 7/2002 | Suzui et al. |
| 2002/0113689 A1 | 8/2002 | Gehlot et al. |
| 2002/0118559 A1 | 8/2002 | Kurokami et al. |
| 2002/0134567 A1 | 9/2002 | Rasmussen et al. |
| 2002/0148497 A1 | 10/2002 | Sasaoka et al. |
| 2002/0149950 A1 | 10/2002 | Takebayashi |
| 2002/0162585 A1 | 11/2002 | Sugawara et al. |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2002/0190696 A1 | 12/2002 | Darshan |
| 2002/0196642 A1* | 12/2002 | Goder ................ H02M 3/33523 363/21.11 |
| 2003/0002303 A1 | 1/2003 | Riggio et al. |
| 2003/0025594 A1 | 2/2003 | Akiyama et al. |
| 2003/0038615 A1 | 2/2003 | Elbanhawy |
| 2003/0047207 A1 | 3/2003 | Aylaian |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | LeRow et al. |
| 2003/0085621 A1 | 5/2003 | Potega |
| 2003/0090233 A1 | 5/2003 | Browe |
| 2003/0090246 A1 | 5/2003 | Shenai et al. |
| 2003/0094931 A1 | 5/2003 | Renyolds |
| 2003/0107352 A1 | 6/2003 | Downer et al. |
| 2003/0111103 A1 | 6/2003 | Bower et al. |
| 2003/0116154 A1 | 6/2003 | Butler et al. |
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0041548 A1 | 3/2004 | Perry |
| 2004/0056642 A1 | 3/2004 | Nebrigic et al. |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1* | 7/2004 | De Rooij ................ H02J 1/102 363/17 |
| 2004/0140719 A1 | 7/2004 | Vulih et al. |
| 2004/0144043 A1 | 7/2004 | Stevenson et al. |
| 2004/0150410 A1 | 8/2004 | Schoepf et al. |
| 2004/0164718 A1 | 8/2004 | McDaniel et al. |
| 2004/0165408 A1 | 8/2004 | West et al. |
| 2004/0167676 A1 | 8/2004 | Mizumaki |
| 2004/0169499 A1 | 9/2004 | Huang et al. |
| 2004/0170038 A1 | 9/2004 | Ichinose et al. |
| 2004/0189090 A1 | 9/2004 | Yanagida et al. |
| 2004/0189432 A1 | 9/2004 | Yan et al. |
| 2004/0201279 A1 | 10/2004 | Templeton |
| 2004/0201933 A1 | 10/2004 | Blanc |
| 2004/0207366 A1 | 10/2004 | Sung |
| 2004/0211458 A1 | 10/2004 | Gui et al. |
| 2004/0223351 A1 | 11/2004 | Kurokami et al. |
| 2004/0230343 A1 | 11/2004 | Zalesski |
| 2004/0233685 A1 | 11/2004 | Matsuo et al. |
| 2004/0246226 A1 | 12/2004 | Moon |
| 2004/0258141 A1 | 12/2004 | Tustison et al. |
| 2004/0263183 A1 | 12/2004 | Naidu et al. |
| 2004/0264225 A1 | 12/2004 | Bhavaraju et al. |
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |
| 2005/0041442 A1 | 2/2005 | Balakrishnan |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0109386 A1 | 5/2005 | Marshall |
| 2005/0110454 A1 | 5/2005 | Tsai et al. |
| 2005/0121067 A1 | 6/2005 | Toyomura et al. |
| 2005/0135031 A1 | 6/2005 | Colby et al. |
| 2005/0139258 A1 | 6/2005 | Liu et al. |
| 2005/0140335 A1 | 6/2005 | Lee et al. |
| 2005/0162018 A1 | 7/2005 | Realmuto et al. |
| 2005/0172995 A1 | 8/2005 | Rohrig et al. |
| 2005/0179420 A1 | 8/2005 | Satoh et al. |
| 2005/0194937 A1 | 9/2005 | Jacobs |
| 2005/0201397 A1 | 9/2005 | Petite |
| 2005/0213272 A1 | 9/2005 | Kobayashi |
| 2005/0218876 A1 | 10/2005 | Nino |

(56) References Cited

U.S. PATENT DOCUMENTS

| | | |
|---|---|---|
| 2005/0225090 A1 | 10/2005 | Wobben |
| 2005/0226017 A1 | 10/2005 | Kotsopoulos et al. |
| 2005/0242795 A1 | 11/2005 | Al-Kuran et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0275979 A1 | 12/2005 | Xu |
| 2005/0281064 A1 | 12/2005 | Olsen et al. |
| 2005/0287402 A1 | 12/2005 | Maly et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0043942 A1 | 3/2006 | Cohen |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0077046 A1 | 4/2006 | Endo |
| 2006/0103360 A9 | 5/2006 | Cutler |
| 2006/0108979 A1 | 5/2006 | Daniel et al. |
| 2006/0109009 A1 | 5/2006 | Banke et al. |
| 2006/0113843 A1 | 6/2006 | Beveridge |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0152085 A1 | 7/2006 | Flett et al. |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222916 A1 | 10/2006 | Norimatsu et al. |
| 2006/0225781 A1 | 10/2006 | Locher |
| 2006/0227577 A1 | 10/2006 | Horiuchi et al. |
| 2006/0227578 A1 | 10/2006 | Datta et al. |
| 2006/0231132 A1 | 10/2006 | Neussner |
| 2006/0232220 A1 | 10/2006 | Melis |
| 2006/0235717 A1 | 10/2006 | Sharma et al. |
| 2006/0237058 A1 | 10/2006 | McClintock et al. |
| 2006/0261751 A1 | 11/2006 | Okabe et al. |
| 2006/0266408 A1 | 11/2006 | Horne et al. |
| 2006/0267515 A1 | 11/2006 | Burke et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0029636 A1 | 2/2007 | Kanemaru et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0085523 A1 | 4/2007 | Scoones et al. |
| 2007/0089778 A1 | 4/2007 | Horne et al. |
| 2007/0103108 A1 | 5/2007 | Capp et al. |
| 2007/0107767 A1 | 5/2007 | Hayden et al. |
| 2007/0115635 A1 | 5/2007 | Low et al. |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0241720 A1 | 10/2007 | Sakamoto et al. |
| 2007/0247135 A1 | 10/2007 | Koga |
| 2007/0247877 A1 | 10/2007 | Kwon et al. |
| 2007/0271006 A1 | 11/2007 | Golden et al. |
| 2007/0273339 A1 | 11/2007 | Haines |
| 2007/0273342 A1 | 11/2007 | Kataoka et al. |
| 2007/0273351 A1 | 11/2007 | Matan |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0024098 A1 | 1/2008 | Hojo |
| 2008/0036440 A1 | 2/2008 | Garmer |
| 2008/0055941 A1* | 3/2008 | Victor .................. H02M 3/158 363/17 |
| 2008/0080177 A1 | 4/2008 | Chang |
| 2008/0088184 A1 | 4/2008 | Tung et al. |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0142071 A1 | 6/2008 | Dorn et al. |
| 2008/0143188 A1* | 6/2008 | Adest .................... H02M 7/42 307/82 |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0164766 A1 | 7/2008 | Adest et al. |
| 2008/0179949 A1 | 7/2008 | Besser et al. |
| 2008/0186004 A1 | 8/2008 | Williams |
| 2008/0191560 A1 | 8/2008 | Besser et al. |
| 2008/0191675 A1 | 8/2008 | Besser et al. |
| 2008/0192519 A1 | 8/2008 | Iwata et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0264470 A1 | 10/2008 | Masuda et al. |
| 2008/0266919 A1 | 10/2008 | Mallwitz |
| 2008/0291707 A1 | 11/2008 | Fang |
| 2008/0294472 A1 | 11/2008 | Yamada |
| 2008/0297963 A1 | 12/2008 | Lee et al. |
| 2008/0298608 A1 | 12/2008 | Wilcox |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |
| 2009/0012917 A1 | 1/2009 | Thompson et al. |
| 2009/0014050 A1 | 1/2009 | Haaf |
| 2009/0014057 A1 | 1/2009 | Croft et al. |
| 2009/0014058 A1 | 1/2009 | Croft et al. |
| 2009/0015071 A1 | 1/2009 | Iwata et al. |
| 2009/0020151 A1 | 1/2009 | Fornage |
| 2009/0021877 A1 | 1/2009 | Fornage et al. |

(56) References Cited

U.S. PATENT DOCUMENTS

| | | |
|---|---|---|
| 2009/0039852 A1 | 2/2009 | Fishelov et al. |
| 2009/0064252 A1 | 3/2009 | Howarter et al. |
| 2009/0066357 A1 | 3/2009 | Fornage |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0078300 A1 | 3/2009 | Ang et al. |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0160258 A1 | 6/2009 | Allen et al. |
| 2009/0179500 A1* | 7/2009 | Ragonese ............... H02J 3/383 |
| | | 307/82 |
| 2009/0179662 A1 | 7/2009 | Moulton et al. |
| 2009/0182532 A1 | 7/2009 | Stoeber et al. |
| 2009/0184746 A1 | 7/2009 | Fahrenbruch |
| 2009/0189456 A1 | 7/2009 | Skutt |
| 2009/0190275 A1 | 7/2009 | Gilmore et al. |
| 2009/0195081 A1 | 8/2009 | Quardt et al. |
| 2009/0206666 A1 | 8/2009 | Sella et al. |
| 2009/0207543 A1 | 8/2009 | Boniface et al. |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0243547 A1 | 10/2009 | Andelfinger |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284232 A1 | 11/2009 | Zhang et al. |
| 2009/0284998 A1 | 11/2009 | Zhang et al. |
| 2009/0295225 A1 | 12/2009 | Asplund et al. |
| 2009/0322494 A1 | 12/2009 | Lee |
| 2009/0325003 A1 | 12/2009 | Aberle et al. |
| 2010/0001587 A1 | 1/2010 | Casey et al. |
| 2010/0002349 A1 | 1/2010 | La Scala et al. |
| 2010/0013452 A1 | 1/2010 | Tang et al. |
| 2010/0020576 A1 | 1/2010 | Falk |
| 2010/0026097 A1 | 2/2010 | Avrutsky et al. |
| 2010/0026736 A1 | 2/2010 | Plut |
| 2010/0038907 A1 | 2/2010 | Hunt et al. |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0071742 A1 | 3/2010 | de Rooij et al. |
| 2010/0071744 A1 | 3/2010 | Peurach et al. |
| 2010/0085670 A1 | 4/2010 | Palaniswami et al. |
| 2010/0115093 A1 | 5/2010 | Rice |
| 2010/0116325 A1 | 5/2010 | Nikoonahad |
| 2010/0124027 A1 | 5/2010 | Handelsman et al. |
| 2010/0124087 A1 | 5/2010 | Falk |
| 2010/0126550 A1 | 5/2010 | Foss |
| 2010/0127570 A1 | 5/2010 | Hadar et al. |
| 2010/0127571 A1 | 5/2010 | Hadar et al. |
| 2010/0132757 A1 | 6/2010 | He et al. |
| 2010/0132758 A1 | 6/2010 | Gilmore |
| 2010/0132761 A1* | 6/2010 | Echizenya ............ H01L 31/048 |
| | | 136/244 |
| 2010/0133911 A1* | 6/2010 | Williams ................ G05F 1/67 |
| | | 307/82 |
| 2010/0139734 A1 | 6/2010 | Hadar et al. |
| 2010/0139743 A1* | 6/2010 | Hadar ..................... H05F 3/02 |
| | | 136/251 |
| 2010/0141041 A1 | 6/2010 | Bose et al. |
| 2010/0147362 A1* | 6/2010 | King ..................... F24S 40/44 |
| | | 136/251 |
| 2010/0154858 A1 | 6/2010 | Jain |
| 2010/0176773 A1 | 7/2010 | Capel |
| 2010/0181957 A1 | 7/2010 | Goeltner |
| 2010/0191383 A1 | 7/2010 | Gaul |
| 2010/0195361 A1 | 8/2010 | Stem |
| 2010/0206378 A1 | 8/2010 | Erickson, Jr. et al. |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0214808 A1 | 8/2010 | Rodriguez |
| 2010/0217551 A1 | 8/2010 | Goff et al. |
| 2010/0229915 A1* | 9/2010 | Ledenev ................ H02J 3/385 |
| | | 136/244 |
| 2010/0231174 A1* | 9/2010 | Li ........................ H02J 7/007192 |
| | | 320/145 |
| 2010/0241375 A1 | 9/2010 | Kumar et al. |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1* | 11/2010 | Lisi ..................... H01L 31/02021 |
| | | 136/244 |
| 2010/0294528 A1 | 11/2010 | Sella et al. |
| 2010/0294903 A1 | 11/2010 | Shmukler et al. |
| 2010/0295680 A1 | 11/2010 | Dumps |
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2010/0309692 A1* | 12/2010 | Chisenga ............... H02J 3/383 |
| | | 363/37 |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |
| 2011/0012430 A1 | 1/2011 | Cheng et al. |
| 2011/0025130 A1 | 2/2011 | Hadar et al. |
| 2011/0031816 A1* | 2/2011 | Buthker ............ H01L 31/02021 |
| | | 307/82 |
| 2011/0031946 A1 | 2/2011 | Egan et al. |
| 2011/0037600 A1 | 2/2011 | Takehara et al. |
| 2011/0043172 A1 | 2/2011 | Dearn |
| 2011/0045802 A1 | 2/2011 | Bland et al. |
| 2011/0049990 A1 | 3/2011 | Amaratunga et al. |
| 2011/0050002 A1 | 3/2011 | De Luca |
| 2011/0050190 A1 | 3/2011 | Avrutsky |
| 2011/0056533 A1 | 3/2011 | Kuan |
| 2011/0061705 A1* | 3/2011 | Croft ..................... H02S 40/32 |
| | | 136/244 |
| 2011/0061713 A1 | 3/2011 | Powell et al. |
| 2011/0062784 A1 | 3/2011 | Wolfs |
| 2011/0068633 A1 | 3/2011 | Quardt et al. |
| 2011/0079263 A1 | 4/2011 | Avrutsky |
| 2011/0080147 A1 | 4/2011 | Schoenlinner et al. |
| 2011/0083733 A1* | 4/2011 | Marroquin ............. H05K 7/10 |
| | | 136/256 |
| 2011/0084553 A1 | 4/2011 | Adest et al. |
| 2011/0103118 A1* | 5/2011 | Serpa .................... H02M 3/158 |
| | | 363/132 |
| 2011/0108087 A1 | 5/2011 | Croft et al. |
| 2011/0114154 A1 | 5/2011 | Lichy et al. |
| 2011/0115295 A1 | 5/2011 | Moon et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |

(56) References Cited

U.S. PATENT DOCUMENTS

| | | |
|---|---|---|
| 2011/0139213 A1 | 6/2011 | Lee |
| 2011/0140536 A1 | 6/2011 | Adest et al. |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0181251 A1 | 7/2011 | Porter et al. |
| 2011/0181340 A1 | 7/2011 | Gazit |
| 2011/0198935 A1 | 8/2011 | Hinman et al. |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0240100 A1 | 10/2011 | Lu et al. |
| 2011/0245989 A1 | 10/2011 | Makhota et al. |
| 2011/0246338 A1 | 10/2011 | Eich |
| 2011/0254372 A1 | 10/2011 | Haines et al. |
| 2011/0260866 A1 | 10/2011 | Avrutsky et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273017 A1 | 11/2011 | Borup et al. |
| 2011/0273302 A1 | 11/2011 | Fornage et al. |
| 2011/0278955 A1 | 11/2011 | Signorelli et al. |
| 2011/0285205 A1 | 11/2011 | Ledenev et al. |
| 2011/0290317 A1 | 12/2011 | Naumovitz et al. |
| 2011/0291486 A1 | 12/2011 | Adest et al. |
| 2011/0298288 A1 | 12/2011 | Cho et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007613 A1 | 1/2012 | Gazit |
| 2012/0019966 A1 | 1/2012 | DeBoer |
| 2012/0026763 A1 | 2/2012 | Humphrey et al. |
| 2012/0026769 A1 | 2/2012 | Schroeder et al. |
| 2012/0032515 A1 | 2/2012 | Ledenev et al. |
| 2012/0033392 A1 | 2/2012 | Golubovic et al. |
| 2012/0033463 A1 | 2/2012 | Rodriguez |
| 2012/0039099 A1 | 2/2012 | Rodriguez |
| 2012/0042588 A1* | 2/2012 | Erickson, Jr. ...... H01L 31/02021 52/173.3 |
| 2012/0043818 A1 | 2/2012 | Stratakos et al. |
| 2012/0044014 A1 | 2/2012 | Stratakos et al. |
| 2012/0044717 A1* | 2/2012 | Suntio ................ H02M 3/33523 363/17 |
| 2012/0048325 A1 | 3/2012 | Matsuo et al. |
| 2012/0049627 A1 | 3/2012 | Matsuo et al. |
| 2012/0049801 A1 | 3/2012 | Chang |
| 2012/0056483 A1 | 3/2012 | Capp et al. |
| 2012/0062177 A1 | 3/2012 | Garrity |
| 2012/0063177 A1* | 3/2012 | Garrity ................... H02J 3/383 363/37 |
| 2012/0080943 A1 | 4/2012 | Phadke |
| 2012/0081009 A1 | 4/2012 | Shteynberg et al. |
| 2012/0081933 A1* | 4/2012 | Garrity ............... H02M 7/4807 363/37 |
| 2012/0081934 A1* | 4/2012 | Garrity ............... H02M 7/4807 363/37 |
| 2012/0081937 A1* | 4/2012 | Phadke ................ H02M 3/156 363/95 |
| 2012/0087159 A1 | 4/2012 | Chapman et al. |
| 2012/0081810 A1 | 4/2012 | Aiello et al. |
| 2012/0091817 A1 | 4/2012 | Seymour et al. |
| 2012/0098344 A1* | 4/2012 | Bergveld .......... H01L 31/02021 307/65 |
| 2012/0104863 A1* | 5/2012 | Yuan ................ H01L 31/02021 307/82 |
| 2012/0113554 A1 | 5/2012 | Paoletti et al. |
| 2012/0119584 A1 | 5/2012 | Hadar et al. |
| 2012/0127764 A1* | 5/2012 | Phadke ................... H02J 3/383 363/37 |
| 2012/0133372 A1 | 5/2012 | Tsai et al. |
| 2012/0138123 A1 | 6/2012 | Newdoll et al. |
| 2012/0139343 A1 | 6/2012 | Adest et al. |
| 2012/0146420 A1 | 6/2012 | Wolfs |
| 2012/0146583 A1 | 6/2012 | Gaul et al. |
| 2012/0161525 A1 | 6/2012 | Huang et al. |
| 2012/0161526 A1* | 6/2012 | Huang ..................... G05F 1/67 307/77 |
| 2012/0161528 A1 | 6/2012 | Mumtaz et al. |
| 2012/0169124 A1 | 7/2012 | Nakashima et al. |
| 2012/0174961 A1 | 7/2012 | Larson et al. |
| 2012/0187769 A1 | 7/2012 | Spannhake et al. |
| 2012/0194003 A1 | 8/2012 | Schmidt et al. |
| 2012/0199172 A1 | 8/2012 | Avrutsky |
| 2012/0215367 A1 | 8/2012 | Eizips et al. |
| 2012/0217973 A1 | 8/2012 | Avrutsky |
| 2012/0223583 A1* | 9/2012 | Cooley ................... H02J 3/385 307/82 |
| 2012/0240490 A1 | 9/2012 | Gangemi |
| 2012/0253533 A1 | 10/2012 | Eizips et al. |
| 2012/0253541 A1* | 10/2012 | Arditi .................... H02J 1/102 700/298 |
| 2012/0255591 A1 | 10/2012 | Arditi et al. |
| 2012/0268969 A1* | 10/2012 | Cuk ........................ H02M 7/48 363/17 |
| 2012/0274145 A1 | 11/2012 | Taddeo |
| 2012/0274264 A1* | 11/2012 | Mun ...................... H01L 31/05 320/101 |
| 2012/0280571 A1 | 11/2012 | Hargis |
| 2013/0002335 A1 | 1/2013 | DeGraaff |
| 2013/0026839 A1 | 1/2013 | Grana |
| 2013/0026840 A1 | 1/2013 | Arditi et al. |
| 2013/0026842 A1* | 1/2013 | Arditi ....................... H02J 1/10 307/82 |
| 2013/0026843 A1 | 1/2013 | Arditi et al. |
| 2013/0038124 A1 | 2/2013 | Newdoll et al. |
| 2013/0039028 A1* | 2/2013 | Korman ............. H01L 31/02013 361/829 |
| 2013/0049710 A1 | 2/2013 | Kraft et al. |
| 2013/0062958 A1* | 3/2013 | Erickson, Jr. ........ H02M 3/1582 307/82 |
| 2013/0063119 A1 | 3/2013 | Lubomirsky |
| 2013/0082724 A1 | 4/2013 | Noda et al. |
| 2013/0094262 A1 | 4/2013 | Avrutsky |
| 2013/0134790 A1 | 5/2013 | Amaratunga et al. |
| 2013/0181533 A1 | 7/2013 | Capp et al. |
| 2013/0192657 A1 | 8/2013 | Hadar et al. |
| 2013/0193765 A1 | 8/2013 | Yoscovich |
| 2013/0214607 A1* | 8/2013 | Harrison ................ H02M 3/335 307/82 |
| 2013/0222144 A1 | 8/2013 | Hadar et al. |
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0269181 A1* | 10/2013 | McBride ................. H02S 40/00 29/825 |
| 2013/0279210 A1 | 10/2013 | Chisenga et al. |
| 2013/0294126 A1 | 11/2013 | Garrity et al. |
| 2013/0307556 A1 | 11/2013 | Ledenev et al. |
| 2013/0321013 A1 | 12/2013 | Pisklak et al. |
| 2013/0332093 A1 | 12/2013 | Adest et al. |
| 2014/0097808 A1 | 4/2014 | Clark et al. |
| 2014/0119076 A1 | 5/2014 | Chang et al. |
| 2014/0167715 A1 | 6/2014 | Wu et al. |
| 2014/0191583 A1 | 7/2014 | Chisenga et al. |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265579 A1 | 9/2014 | Mumtaz |
| 2014/0265629 A1 | 9/2014 | Gazit et al. |
| 2014/0265638 A1 | 9/2014 | Orr et al. |
| 2014/0306543 A1 | 10/2014 | Garrity et al. |
| 2014/0327313 A1 | 11/2014 | Arditi et al. |
| 2015/0022006 A1 | 1/2015 | Garrity et al. |
| 2015/0028683 A1 | 1/2015 | Hadar et al. |

(56) References Cited

U.S. PATENT DOCUMENTS

| | | | |
|---|---|---|---|
| 2015/0028692 A1 | 1/2015 | Makhota et al. | |
| 2015/0188415 A1 | 7/2015 | Abido et al. | |
| 2015/0263609 A1 | 9/2015 | Weida et al. | |
| 2015/0364918 A1 | 12/2015 | Singh et al. | |
| 2015/0372490 A1* | 12/2015 | Bakas | H02J 3/385 307/52 |

FOREIGN PATENT DOCUMENTS

| | | |
|---|---|---|
| AU | 2012225199 A1 | 10/2013 |
| CA | 1183574 A | 3/1985 |
| CA | 2063243 A1 | 12/1991 |
| CA | 2301657 A1 | 3/1999 |
| CA | 2394761 A1 | 6/2001 |
| CA | 2658087 A1 | 6/2001 |
| CA | 2443450 A1 | 3/2005 |
| CA | 2572452 A1 | 1/2006 |
| CA | 2613038 A1 | 1/2007 |
| CA | 2704605 A1 | 5/2009 |
| CN | 2071396 U | 2/1991 |
| CN | 2305016 Y | 1/1999 |
| CN | 1236213 A | 11/1999 |
| CN | 1244745 A | 2/2000 |
| CN | 1262552 A | 8/2000 |
| CN | 1064487 C | 4/2001 |
| CN | 1309451 A | 8/2001 |
| CN | 1362655 A | 8/2002 |
| CN | 2514538 Y | 10/2002 |
| CN | 1122905 C | 10/2003 |
| CN | 1474492 A | 2/2004 |
| CN | 1503379 A | 6/2004 |
| CN | 1523726 A | 8/2004 |
| CN | 1185782 C | 1/2005 |
| CN | 2672938 Y | 1/2005 |
| CN | 1588773 A | 3/2005 |
| CN | 2706955 Y | 6/2005 |
| CN | 1245795 C | 3/2006 |
| CN | 1787717 A | 6/2006 |
| CN | 1838191 A | 9/2006 |
| CN | 1841254 A | 10/2006 |
| CN | 1841823 A | 10/2006 |
| CN | 1892239 A | 1/2007 |
| CN | 1902809 A | 1/2007 |
| CN | 1929276 A | 3/2007 |
| CN | 1930925 A | 3/2007 |
| CN | 1933315 A | 3/2007 |
| CN | 2891438 Y | 4/2007 |
| CN | 101030752 A | 9/2007 |
| CN | 101050770 A | 10/2007 |
| CN | 101107712 A | 1/2008 |
| CN | 100371843 C | 2/2008 |
| CN | 101128974 A | 2/2008 |
| CN | 101136129 A | 3/2008 |
| CN | 101180781 A | 5/2008 |
| CN | 101257221 A | 9/2008 |
| CN | 100426175 C | 10/2008 |
| CN | 201167381 Y | 12/2008 |
| CN | 201203438 Y | 3/2009 |
| CN | 101488271 A | 7/2009 |
| CN | 101521459 A | 9/2009 |
| CN | 101523230 A | 9/2009 |
| CN | 101672252 A | 3/2010 |
| CN | 101752877 A | 6/2010 |
| CN | 101779291 A | 7/2010 |
| CN | 101847939 A | 9/2010 |
| CN | 201601477 U | 10/2010 |
| CN | 201623478 U | 11/2010 |
| CN | 101902051 A | 12/2010 |
| CN | 101904015 A | 12/2010 |
| CN | 101904073 A | 12/2010 |
| CN | 201663167 U | 12/2010 |
| CN | 101939660 A | 1/2011 |
| CN | 101951011 A | 1/2011 |
| CN | 101951190 A | 1/2011 |
| CN | 101953051 A | 1/2011 |
| CN | 101953060 A | 1/2011 |
| CN | 101958555 A | 1/2011 |
| CN | 101976855 A | 2/2011 |
| CN | 101976952 A | 2/2011 |
| CN | 101980409 A | 2/2011 |
| CN | 102089883 A | 6/2011 |
| CN | 102148584 A | 8/2011 |
| CN | 201926948 U | 8/2011 |
| CN | 201956938 U | 8/2011 |
| CN | 202034903 U | 11/2011 |
| CN | 102273039 A | 12/2011 |
| CN | 202103601 U | 1/2012 |
| CN | 102362550 A | 2/2012 |
| CN | 202178274 U | 3/2012 |
| CN | 102474112 A | 5/2012 |
| CN | 202871823 U | 4/2013 |
| CN | 104319761 A | 1/2015 |
| DE | 1161639 B | 1/1964 |
| DE | 3236071 A1 | 1/1984 |
| DE | 3525630 A1 | 1/1987 |
| DE | 3729000 A1 | 3/1989 |
| DE | 4019710 A1 | 1/1992 |
| DE | 4032569 A1 | 4/1992 |
| DE | 4041672 A1 | 6/1992 |
| DE | 4232356 A1 | 3/1994 |
| DE | 4325436 A1 | 2/1995 |
| DE | 4328511 A1 | 3/1995 |
| DE | 19515786 A1 | 11/1995 |
| DE | 19502762 A1 | 8/1996 |
| DE | 19609189 A1 | 9/1997 |
| DE | 19618882 A1 | 11/1997 |
| DE | 19701897 A1 | 7/1998 |
| DE | 19718046 A1 | 11/1998 |
| DE | 19732218 C1 | 3/1999 |
| DE | 19737286 A1 | 3/1999 |
| DE | 19838230 A1 | 2/2000 |
| DE | 19846818 A1 | 4/2000 |
| DE | 19904561 C1 | 8/2000 |
| DE | 19928809 A1 | 1/2001 |
| DE | 019937410 A1 | 2/2001 |
| DE | 19961705 A1 | 7/2001 |
| DE | 10064039 A1 | 12/2001 |
| DE | 10060108 A1 | 6/2002 |
| DE | 10103431 A1 | 8/2002 |
| DE | 10136147 A1 | 2/2003 |
| DE | 10219956 A1 | 4/2003 |
| DE | 10222621 A1 | 11/2003 |
| DE | 202004001246 U1 | 4/2004 |
| DE | 10345302 A1 | 4/2005 |
| DE | 102004043478 A1 | 4/2005 |
| DE | 102004053942 A1 | 5/2006 |
| DE | 69734495 T2 | 7/2006 |
| DE | 69735169 T2 | 8/2006 |
| DE | 102005018173 A1 | 10/2006 |
| DE | 20 2005 020161 U1 | 11/2006 |
| DE | 102005036153 A1 | 12/2006 |
| DE | 102005030907 A1 | 1/2007 |
| DE | 102005032864 A1 | 1/2007 |
| DE | 102006023563 A1 | 11/2007 |
| DE | 102006026073 A1 | 12/2007 |
| DE | 202007002077 U1 | 4/2008 |
| DE | 102006060815 A1 | 6/2008 |
| DE | 102007051134 A1 | 3/2009 |
| DE | 202008012345 U1 | 3/2009 |
| DE | 102007037130 B3 | 4/2009 |
| DE | 102007050031 B3 | 4/2009 |
| DE | 202009007318 U1 | 8/2009 |
| DE | 102008057874 A1 | 5/2010 |
| DE | 102009051186 A1 | 5/2010 |
| DE | 102009022569 A1 | 12/2010 |
| DE | 102010023549 A1 | 12/2011 |
| DE | 102013106255 A1 | 12/2014 |
| EP | 0027405 A1 | 4/1981 |
| EP | 169673 A1 | 1/1986 |
| EP | 0178757 A2 | 4/1986 |
| EP | 0206253 A1 | 12/1986 |
| EP | 0231211 A1 | 8/1987 |
| EP | 0293219 A2 | 11/1988 |

(56) References Cited

FOREIGN PATENT DOCUMENTS

| | | |
|---|---|---|
| EP | 0340006 A2 | 11/1989 |
| EP | 0418612 A1 | 3/1991 |
| EP | 419093 A2 | 3/1991 |
| EP | 420295 A1 | 4/1991 |
| EP | 0521467 A2 | 1/1993 |
| EP | 0576271 A2 | 12/1993 |
| EP | 0577334 A2 | 1/1994 |
| EP | 604777 A1 | 7/1994 |
| EP | 0628901 A2 | 12/1994 |
| EP | 0642199 A1 | 3/1995 |
| EP | 0670915 A1 | 9/1995 |
| EP | 756178 A2 | 1/1997 |
| EP | 0756372 A1 | 1/1997 |
| EP | 0780750 A2 | 6/1997 |
| EP | 0809293 A1 | 11/1997 |
| EP | 827254 A2 | 3/1998 |
| EP | 0895146 A1 | 2/1999 |
| EP | 0906660 A1 | 4/1999 |
| EP | 0947905 A2 | 10/1999 |
| EP | 1012886 A1 | 6/2000 |
| EP | 1024575 A2 | 8/2000 |
| EP | 1034465 A1 | 9/2000 |
| EP | 1035640 A1 | 9/2000 |
| EP | 1039361 A1 | 9/2000 |
| EP | 1039620 A2 | 9/2000 |
| EP | 1039621 A2 | 9/2000 |
| EP | 1047179 A1 | 10/2000 |
| EP | 1130770 A2 | 9/2001 |
| EP | 1143594 A2 | 10/2001 |
| EP | 1187291 A2 | 3/2002 |
| EP | 1235339 A2 | 8/2002 |
| EP | 1239573 A1 | 9/2002 |
| EP | 1239576 A2 | 9/2002 |
| EP | 1254505 A2 | 11/2002 |
| EP | 1271742 A2 | 1/2003 |
| EP | 1330009 A2 | 7/2003 |
| EP | 1339153 A2 | 8/2003 |
| EP | 1369983 A1 | 12/2003 |
| EP | 1376706 A2 | 1/2004 |
| EP | 1388774 A1 | 2/2004 |
| EP | 1400988 A2 | 3/2004 |
| EP | 1407534 A2 | 4/2004 |
| EP | 1418482 A1 | 5/2004 |
| EP | 1429393 A2 | 6/2004 |
| EP | 1442473 A2 | 8/2004 |
| EP | 1447561 A1 | 8/2004 |
| EP | 1457857 A2 | 9/2004 |
| EP | 1463188 A2 | 9/2004 |
| EP | 1475882 A2 | 11/2004 |
| EP | 1503490 A1 | 2/2005 |
| EP | 1521345 A1 | 4/2005 |
| EP | 1526633 A2 | 4/2005 |
| EP | 1531542 A2 | 5/2005 |
| EP | 1531545 A1 | 5/2005 |
| EP | 1532727 A2 | 5/2005 |
| EP | 1552563 A2 | 7/2005 |
| EP | 1562281 A1 | 8/2005 |
| EP | 1580862 A1 | 9/2005 |
| EP | 1603212 A2 | 12/2005 |
| EP | 1610571 A2 | 12/2005 |
| EP | 1623495 A1 | 2/2006 |
| EP | 1642355 A2 | 4/2006 |
| EP | 1657557 A1 | 5/2006 |
| EP | 1657797 A1 | 5/2006 |
| EP | 1691246 A2 | 8/2006 |
| EP | 1706937 A1 | 10/2006 |
| EP | 1708070 A1 | 10/2006 |
| EP | 1716272 A1 | 11/2006 |
| EP | 1728413 A1 | 12/2006 |
| EP | 1750193 A1 | 2/2007 |
| EP | 1766490 A1 | 3/2007 |
| EP | 1782146 A2 | 5/2007 |
| EP | 1785800 A1 | 5/2007 |
| EP | 1842121 A2 | 10/2007 |
| EP | 1887675 A2 | 2/2008 |
| EP | 1901419 A2 | 3/2008 |
| EP | 1902349 A2 | 3/2008 |
| EP | 1911101 A1 | 4/2008 |
| EP | 1914857 A1 | 4/2008 |
| EP | 2048679 A1 | 4/2009 |
| EP | 2061088 A2 | 5/2009 |
| EP | 2092625 A2 | 8/2009 |
| EP | 2092631 A2 | 8/2009 |
| EP | 2130286 A1 | 12/2009 |
| EP | 2135296 A2 | 12/2009 |
| EP | 2135348 A2 | 12/2009 |
| EP | 2144133 A1 | 1/2010 |
| EP | 2206159 A2 | 7/2010 |
| EP | 2232690 A1 | 9/2010 |
| EP | 2234237 A1 | 9/2010 |
| EP | 2249457 A1 * | 11/2010 ............. H02S 40/32 |
| EP | 2249457 A1 | 11/2010 |
| EP | 2256819 A1 | 12/2010 |
| EP | 2315328 A2 | 4/2011 |
| EP | 2355268 A1 | 8/2011 |
| EP | 2374190 A1 | 10/2011 |
| EP | 2386122 A2 | 11/2011 |
| EP | 2393178 A2 | 12/2011 |
| EP | 2495766 A1 | 9/2012 |
| EP | 2533299 A1 | 12/2012 |
| EP | 2549635 A1 | 1/2013 |
| EP | 2561596 A2 | 2/2013 |
| EP | 2621045 A2 | 7/2013 |
| EP | 2666222 A1 | 11/2013 |
| EP | 2722979 A1 | 4/2014 |
| EP | 2779251 A1 | 9/2014 |
| ES | 2249147 A1 | 3/2006 |
| ES | 2249149 A1 | 3/2006 |
| FR | 2796216 A1 | 1/2001 |
| FR | 2819653 A1 | 7/2002 |
| GB | 1211885 A | 11/1970 |
| GB | 1261838 A | 1/1972 |
| GB | 1571681 A | 7/1980 |
| GB | 1597508 A | 9/1981 |
| GB | 2128017 A | 4/1984 |
| GB | 2327208 A | 1/1999 |
| GB | 2339465 A | 1/2000 |
| GB | 2376801 A | 12/2002 |
| GB | 2399463 A | 9/2004 |
| GB | 2399465 A | 9/2004 |
| GB | 2415841 A | 1/2006 |
| GB | 2419968 A | 5/2006 |
| GB | 2421847 A | 7/2006 |
| GB | 2476508 A | 6/2011 |
| GB | 2480015 A | 11/2011 |
| GB | 2480015 B | 12/2011 |
| GB | 2482653 A | 2/2012 |
| GB | 2483317 A | 3/2012 |
| GB | 2485527 A | 5/2012 |
| GB | 2486408 A | 6/2012 |
| GB | 2487368 A | 7/2012 |
| GB | 2497275 A | 6/2013 |
| GB | 2498365 A | 7/2013 |
| GB | 2498790 A | 7/2013 |
| GB | 2498791 A | 7/2013 |
| GB | 2499991 A | 9/2013 |
| JP | 61065320 A | 4/1986 |
| JP | H01311874 A | 12/1989 |
| JP | 04127581 A * | 4/1992 ............. H01L 31/04 |
| JP | H04219982 A | 8/1992 |
| JP | H04364378 A | 12/1992 |
| JP | 8009557 A | 1/1996 |
| JP | H0897460 A | 4/1996 |
| JP | H08116628 A | 5/1996 |
| JP | H08185235 A | 7/1996 |
| JP | H08227324 A | 9/1996 |
| JP | H08316517 A | 11/1996 |
| JP | H08317664 A | 11/1996 |
| JP | H094692 A | 1/1997 |
| JP | H09148611 A | 6/1997 |
| JP | H09275644 A | 10/1997 |
| JP | 2676789 B2 | 11/1997 |
| JP | H1017445 A | 1/1998 |
| JP | H1075580 A | 3/1998 |

(56) References Cited

FOREIGN PATENT DOCUMENTS

| | | |
|---|---|---|
| JP | H10201086 A | 7/1998 |
| JP | H10308523 A | 11/1998 |
| JP | 11041832 A | 2/1999 |
| JP | H1146457 A | 2/1999 |
| JP | 11103538 A | 4/1999 |
| JP | 2892183 B2 | 5/1999 |
| JP | 11206038 A | 7/1999 |
| JP | H11266545 A | 9/1999 |
| JP | 11289891 A | 10/1999 |
| JP | 11318042 A | 11/1999 |
| JP | 2000020150 A | 1/2000 |
| JP | 3015512 B2 | 3/2000 |
| JP | 2000160789 A | 6/2000 |
| JP | 2000166097 A | 6/2000 |
| JP | 2000174307 A | 6/2000 |
| JP | 2000232791 A | 8/2000 |
| JP | 2000232793 A | 8/2000 |
| JP | 2000316282 A | 11/2000 |
| JP | 2000324852 A | 11/2000 |
| JP | 2000339044 A | 12/2000 |
| JP | 2000341974 A | 12/2000 |
| JP | 2000347753 A | 12/2000 |
| JP | 2000358330 A | 12/2000 |
| JP | 2001060120 A | 3/2001 |
| JP | 2001075662 A | 3/2001 |
| JP | 2001178145 A | 6/2001 |
| JP | 2001189476 A | 7/2001 |
| JP | 2001224142 A | 8/2001 |
| JP | 2001250964 A | 9/2001 |
| JP | 2002073184 A | 3/2002 |
| JP | 2002238246 A | 8/2002 |
| JP | 2002270876 A | 9/2002 |
| JP | 2002300735 A | 10/2002 |
| JP | 2002339591 A | 11/2002 |
| JP | 2002354677 A | 12/2002 |
| JP | 2003102134 A | 4/2003 |
| JP | 2003124492 A | 4/2003 |
| JP | 2003134661 A | 5/2003 |
| JP | 2003134667 A | 5/2003 |
| JP | 2003282916 A | 10/2003 |
| JP | 2003289674 A | 10/2003 |
| JP | 2004055603 A | 2/2004 |
| JP | 2004111754 A | 4/2004 |
| JP | 2004194500 A | 7/2004 |
| JP | 2004260944 A | 9/2004 |
| JP | 2004312994 A | 11/2004 |
| JP | 2004334704 A | 11/2004 |
| JP | 3656531 B2 | 6/2005 |
| JP | 2005192314 A | 7/2005 |
| JP | 2005251039 A | 9/2005 |
| JP | 2006041440 A | 2/2006 |
| JP | 2006278755 A | 10/2006 |
| JP | 2007058845 A | 3/2007 |
| JP | 4174227H B2 | 10/2008 |
| JP | 2010-146047 A | 7/2010 |
| JP | 2010245532 A | 10/2010 |
| JP | 2011-249790 A | 12/2011 |
| JP | 2012099764 A | 5/2012 |
| JP | 2012511299 A | 5/2012 |
| JP | 2012178535 A | 9/2012 |
| KR | 20010044490 A | 6/2001 |
| KR | 20040086088 A | 10/2004 |
| KR | 100468127 B1 | 1/2005 |
| KR | 200402282 Y1 | 11/2005 |
| KR | 100725755 B1 | 5/2007 |
| KR | 100912892 B1 | 8/2009 |
| KR | 101073143 B1 | 10/2011 |
| NL | 1011483 C2 | 9/2000 |
| TW | 497326 B | 8/2002 |
| TW | 200913291 A | 3/2009 |
| WO | 8202134 A1 | 6/1982 |
| WO | 1982002134 A1 | 6/1982 |
| WO | 1984003402 A1 | 8/1984 |
| WO | 1988004801 A1 | 6/1988 |
| WO | 1992007418 A1 | 4/1992 |
| WO | 1993013587 A1 | 7/1993 |
| WO | 95/25374 A1 | 9/1995 |
| WO | 95/34121 A1 | 12/1995 |
| WO | 1996007130 A1 | 3/1996 |
| WO | 1996013093 A1 | 5/1996 |
| WO | 1998023021 A2 | 5/1998 |
| WO | 1999028801 A1 | 6/1999 |
| WO | 00/00839 A1 | 1/2000 |
| WO | 00/21178 A1 | 4/2000 |
| WO | 0075947 A1 | 12/2000 |
| WO | 0077522 A1 | 12/2000 |
| WO | 01/13502 A1 | 2/2001 |
| WO | 01047095 A2 | 6/2001 |
| WO | 0231517 | 4/2002 |
| WO | 02056126 A1 | 7/2002 |
| WO | 0278164 A1 | 10/2002 |
| WO | 02078164 A1 | 10/2002 |
| WO | 02093655 A1 | 11/2002 |
| WO | 03012569 A1 | 2/2003 |
| WO | 2003012569 A1 | 2/2003 |
| WO | 03/026114 A2 | 3/2003 |
| WO | 2003050938 A2 | 6/2003 |
| WO | 2003071655 A1 | 8/2003 |
| WO | 03084041 A1 | 10/2003 |
| WO | 2003098703 | 11/2003 |
| WO | 2004001942 A1 | 12/2003 |
| WO | 2004006342 A1 | 1/2004 |
| WO | 2004008619 A2 | 1/2004 |
| WO | 2004023278 A2 | 3/2004 |
| WO | 2004053993 A1 | 6/2004 |
| WO | 2004090993 A2 | 10/2004 |
| WO | 2004098261 A2 | 11/2004 |
| WO | 2004100344 A2 | 11/2004 |
| WO | 2004100348 A1 | 11/2004 |
| WO | 2004107543 A2 | 12/2004 |
| WO | 2005015584 A2 | 2/2005 |
| WO | 2005027300 A1 | 3/2005 |
| WO | 2005053189 A1 | 6/2005 |
| WO | 2005069096 A1 | 7/2005 |
| WO | 2005076444 A1 | 8/2005 |
| WO | 2005076445 A1 | 8/2005 |
| WO | 2005089030 A1 | 9/2005 |
| WO | 2005112551 A2 | 12/2005 |
| WO | 2005119278 A1 | 12/2005 |
| WO | 2005119609 A2 | 12/2005 |
| WO | 2005124498 A1 | 12/2005 |
| WO | 2006002380 A2 | 1/2006 |
| WO | 2006005125 A1 | 1/2006 |
| WO | 2006007198 A1 | 1/2006 |
| WO | 2006011071 A2 | 2/2006 |
| WO | 2006011359 A1 | 2/2006 |
| WO | 2006013600 A2 | 2/2006 |
| WO | 2006048688 A2 | 5/2006 |
| WO | 2006048689 A2 | 5/2006 |
| WO | 2006/074561 A1 | 7/2006 |
| WO | 2006071436 A2 | 7/2006 |
| WO | 2006078685 A2 | 7/2006 |
| WO | 2006079503 A2 | 8/2006 |
| WO | 2006089778 A2 | 8/2006 |
| WO | 2006110613 A2 | 10/2006 |
| WO | 2006130520 A2 | 12/2006 |
| WO | 2007006564 A1 | 1/2007 |
| WO | 2007007360 A2 | 1/2007 |
| WO | 2007010326 A1 | 1/2007 |
| WO | 2007/020419 A1 | 2/2007 |
| WO | 2007048421 A2 | 5/2007 |
| WO | 2007072517 A1 | 6/2007 |
| WO | 2007073951 A1 | 7/2007 |
| WO | 2007080429 A2 | 7/2007 |
| WO | 2007084196 A2 | 7/2007 |
| WO | 2007090476 A2 | 8/2007 |
| WO | 2007113358 A1 | 10/2007 |
| WO | 2007124518 A1 | 11/2007 |
| WO | 2008008528 A2 | 1/2008 |
| WO | 2008026207 A2 | 3/2008 |
| WO | 2008/046370 A1 | 4/2008 |
| WO | 2008077473 A2 | 7/2008 |
| WO | 2008097591 A2 | 8/2008 |
| WO | 2008/112080 A1 | 9/2008 |

(56) References Cited

FOREIGN PATENT DOCUMENTS

| WO | 2008119034 A1 | 10/2008 |
|---|---|---|
| WO | 2008121266 A2 | 10/2008 |
| WO | 2008125915 A2 | 10/2008 |
| WO | 2008132551 A2 | 11/2008 |
| WO | 2008132553 A2 | 11/2008 |
| WO | 2008142480 A2 | 11/2008 |
| WO | 2009006879 A2 | 1/2009 |
| WO | 2009007782 A2 | 1/2009 |
| WO | 2009011780 A2 | 1/2009 |
| WO | 2009020917 A2 | 2/2009 |
| WO | 2009/026602 A1 | 3/2009 |
| WO | 2009046533 A1 | 4/2009 |
| WO | 2009051221 A1 | 4/2009 |
| WO | 2009051222 A1 | 4/2009 |
| WO | 2009051853 A1 | 4/2009 |
| WO | 2009051870 A1 | 4/2009 |
| WO | 2009/059877 A1 | 5/2009 |
| WO | 2009056957 A2 | 5/2009 |
| WO | 2009059028 A2 | 5/2009 |
| WO | 2009064683 A2 | 5/2009 |
| WO | 2009/072075 A2 | 6/2009 |
| WO | 2009/073867 A1 | 6/2009 |
| WO | 2009072077 A1 | 6/2009 |
| WO | 2009073868 A1 | 6/2009 |
| WO | 2009073995 A1 | 6/2009 |
| WO | 2009114341 A2 | 9/2009 |
| WO | 2009118682 A2 | 10/2009 |
| WO | 2009118683 A2 | 10/2009 |
| WO | 2009136358 A1 | 11/2009 |
| WO | 2009155392 A1 | 12/2009 |
| WO | 2010/002960 A1 | 1/2010 |
| WO | 2010/003941 A2 | 1/2010 |
| WO | 2010014116 A1 | 2/2010 |
| WO | 2010020385 A2 | 2/2010 |
| WO | 2010037393 A1 | 4/2010 |
| WO | 2010/071855 A2 | 6/2010 |
| WO | 2010062662 A2 | 6/2010 |
| WO | 2010065043 A1 | 6/2010 |
| WO | 2010065388 A1 | 6/2010 |
| WO | 2010072717 A1 | 7/2010 |
| WO | 2010078303 A2 | 7/2010 |
| WO | 2010080672 A2 | 7/2010 |
| WO | 2010091025 A2 | 8/2010 |
| WO | 2010094012 A1 | 8/2010 |
| WO | 2010118503 A1 | 10/2010 |
| WO | 2010/132369 A1 | 11/2010 |
| WO | 2010134057 A1 | 11/2010 |
| WO | 20100134057 A1 | 11/2010 |
| WO | 2011005339 A1 | 1/2011 |
| WO | 2011011711 A2 | 1/2011 |
| WO | 2011014275 A1 | 2/2011 |
| WO | 2011017721 A1 | 2/2011 |
| WO | 2011019936 A1 | 2/2011 |
| WO | 2011023732 A1 | 3/2011 |
| WO | 2011028456 A2 | 3/2011 |
| WO | 2011028457 A2 | 3/2011 |
| WO | 2011044641 A1 | 4/2011 |
| WO | 2011059067 A1 | 5/2011 |
| WO | 2011074025 A1 | 6/2011 |
| WO | 2011076707 A2 | 6/2011 |
| WO | 2011085259 A2 | 7/2011 |
| WO | 2011089607 A1 | 7/2011 |
| WO | 2011119587 A2 | 9/2011 |
| WO | 2011133843 A2 | 10/2011 |
| WO | 2011133928 A2 | 10/2011 |
| WO | 2011151672 A1 | 12/2011 |
| WO | 2013015921 A1 | 1/2013 |
| WO | 1998023021 A | 7/2013 |
| WO | 2013130563 A1 | 9/2013 |

OTHER PUBLICATIONS

Solarabcs Org et al. "Solar America Board for Codes and Standards Grounding Photovoltaic Modules" Mar. 1, 2011.
QT Technical Application Papers, "ABB Circuit-Breakers for Direct current Applications", ABB SACE S.p.A., An ABB Group Company, L.V. Breakers, Via Baioni, 35, 24123 Bergamo-Italy, Tel.: +39 035.395.111—Telefax: +39 035.395.306-433, Sep. 2007.
Woyte, et al., "Mains Monitoring and Protection in a European Context", 17th European Photovoltaic Solar Energy Conference and Exhibition, Munich, Germany, Oct. 22-26, 2001, ACHIM, Woyte, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. OH Feb. 1, 2001.
"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
International Search Report and Opinion of International Patent Application PCT/2009/051221, dated Oct. 19, 2009.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
ISR for PCT/IL07/01064 dated Mar. 25, 2008.
IPRP for PCT/IB2007/004584 dated Jun. 10, 2009, with Written Opinion.
IPRP for PCT/IB2007/004591 dated Jul. 13, 2010, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), dated Sep. 16, 2011.
UK Intellectual Property Office, Patents Act 1977: Patents Rules Notification of Grant: Patent Serial No. GB2480015, dated Nov. 29, 2011.
Walker, et al. "PV String Per-Module Maximum Power Point Enabling Converters", School of Information Technology and Electrical Engineering The University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Pro-

(56) References Cited

OTHER PUBLICATIONS ceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—date of issue Jun. 10, 2009.
Extended European Search Report—EP12176089.6—dated Nov. 8, 2012.
Gwon-Jong Yu et al: "Maximum power point tracking with temperature compensation of photovoltaic for air conditioning system with fuzzy controller", May 13, 1996; May 13, 1996-May 17, 1996, May 13, 1996 ( May 13, 1996), pp. 1429-1432, XP010208423.
Extended European Search Report—EP12177067.1—dated Dec. 7, 2012.
GB Combined Search and Examination Report—GB1200423.0—dated Apr. 30, 2012.
GB Combined Search and Examination Report—GB1201499.9—dated May 28, 2012.
GB Combined Search and Examination Report—GB1201506.1—dated May 22, 2012.
"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", José Rodríguez et al., IEEE Transactions on Industrial Electronics, vol. 49, No. 4, Aug. 2002.
Extended European Search Report—EP 08878650.4—dated Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.
Robert W. Erickson, "Future of Power Electronics for Photovoltaics", IEEE Applied Power Electronics Conference, Feb. 2009.
International Search Report for corresponding PCT/GB2004/001965, completed Aug. 16, 2004 by A. Roider.
Naik et al., A Novel Grid Interface for Photovoltaic, Wind-Electric, and Fuel-Cell Systems With a Controllable Power Factor or Operation, IEEE, 1995, pp. 995-998.
Petkanchin, Processes following changes of phase angle between current and voltage in electric circuits, Aug. 1999, Power Engineering Review, IEEE vol. 19, Issue 8, pp. 59-60.

Mumtaz, Asim, et al., "Grid Connected PV Inverter Using a Commercially Available Power IC," PV in Europe Conference, Oct. 2002, 3 pages, Rome, Italy.
Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.
European Search Report—EP App. 14159457.2—dated Jun. 12, 2015.
European Search Report and Written Opinion—EP Appl. 12150819.6—dated Jul. 6, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.
Chinese Office Action—CN Appl. 201280006369.2—dated Aug. 4, 2015.
Chinese Office Action—CN Appl. 201210253614.1—dated Aug. 18, 2015.
Extended European Search Report, EP Application 04753488.8, dated Apr. 29, 2015.
International Search Report from PCT/US04/16668, form PCT/ISA/220, filing date May 27, 2004.
Office Action U.S. Appl. No. 13/785,857, dated Jun. 6, 2013.
Partial Extended European Search Report, EP Application 04753488.8, dated Feb. 2, 2015.
The International Search Report (Form PCT /ISA/220) Issued in corresponding international application No. PCT/US04/16668, filed May 27, 2004.
International Search Report—PCT/US2004/016668, form PCT/ISA/220—filing date May 27, 2004—dated Jan. 19, 2005.
Written Opinion of the International Searching Authority—PCT/US2004/016668, form PCT/ISA/220—filing date May 27, 2004—dated Jan. 19, 2005.
Extended European Search Report—EP Appl. 04753488.8—dated Apr. 29, 2015.
Supplementary Partial European Search Report—EP Appl. 04753488.8—dated Feb. 2, 2015.
U.S. Office Action—U.S. Appl. No. 13/785,857—dated Jun. 6, 2013.
European Office Action—EP Appl. 09725443.7—dated Aug. 18, 2015.
Definition of Isomorphism by Merriam-Webster, <http://www.merriaum-webster.com/dictionary/isomorphism, dated Oct. 20, 2015.
Definition of Isomorphic by Merriam-Webster, <http://www.merriam-webster.com/dictionary/isomorphic, dated Oct. 20, 2015.
Chinese Office Action—CN Appl. 201110349734.7—dated Oct. 13, 2015.
Chinese Office Action—CN Appl. 201210007491.3—dated Nov. 23, 2015.
European Office Action—EP Appl. 12176089.6—dated Dec. 16, 2015.
Chinese Office Action—CN Appl. 201310035223.7—dated Dec. 29, 2015.
Chinese Office Action—CN Application 201210334311.2—dated Jan. 20, 2016.
European Search Report—EP Appl. 13800859.4—dated Feb. 15, 2016.
Chinese Office Action—CN App. 201310035221.8—dated Mar. 1, 2016.
PCT/2008/058473 International Preliminary Report, 6 pages, dated Nov. 2, 2009.
International Search Report and Written Opinion, WO 2010080672, dated Aug. 19, 2010.
PCT/US2010/045352 International Search Report and Written Opinion; 12 pages; dated Oct. 26, 2010.
International Search Report and Written Opinion dated Feb. 6, 2009,. In counterpart PCT/US2008/008451, 13 pages.

(56) References Cited

OTHER PUBLICATIONS

European Search Report: dated Jan. 10, 2013 in corresponding EP application No. 09838022.3, 7 pages.
D. Ton and W. Bower; Summary Report of the DOE High-Tech Inverter Workshop; Jan. 2005.
First Action Interview Pre-Interview Communication from U.S. Appl. No. 13/174,495 dated Jun. 18, 2014, 7 pgs.
Johnson et al., "Arc-fault detector algorithm evaluation method utilizing prerecorded arcing signatures", Photovoltaic Specialists Conference (PVSC), Jun. 2012.
Philippe Welter, et al. "Electricity at 32 kHz," Photon International, The Photovoltaic Magazine, Http://www.photon-magazine.com/archiv/articles.aspx?criteria=4&HeftNr=0807&Title=Elec . . . printed May 27, 2011).
PCT/US2009/069582 Int. Search Report—dated Aug. 19, 2010.
Chinese Office Action—CN Appl. 201210007491.3—dated Apr. 25, 2016.
CN Office Action—CN Appl. 201310004123.8—dated May 5, 2016.
Law et al, "Design and Analysis of Switched-Capacitor-Based Step-Up Resonant Converters," IEEE Transactions on Circuits and Systems, vol. 52, No. 5, published May 2005.
CN Office Action—CN Appl. 201310066888.4—dated May 30, 2016.
European Search Report—EP Appl. 13152966.1—dated Jul. 21, 2016.
European Search Report—EP Appl. 12183811.4—dated Aug. 4, 2016.
European Notice of Opposition—EP Patent 2374190—dated Jul. 19, 2016.
"Es werde Dunkelheit. Freischaltung von Solarmodulen im Brandfall"—"Let there be Darkness: Quality control of Solar Modules in Case of Fire"; Photon, May 2005, 75-77, ISSN 1430-5348, English translation provided.
Chinese Office Action—CN Appl. 201380029450.7—dated Jul. 28, 2016.
GB Combined Search and Examination Report—GB1203763.6—dated Jun. 25, 2012.
Mohammad Reza Amini et al., "Quasi Resonant DC Link Inverter with a Simple Auxiliary Circuit", Journal of Power Electronics, vol. 11, No. 1, Jan. 2011.
Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
Cheng K.W.E., "New Generation of Switched Capacitor Converters", Department of Electrical Engineering, The Hong Kong Polytechnic University, Hung Hom, Hong Kong, Power Electronics Conference, 1998, PESC 98.
1999—Per Karlsson, "Quasi Resonant DC Link Converters—Analysis and Design for a Battery Charger Application", Universitetstryckeriet, Lund University, 1999, ISBN 91-88934-14-4; Added to Lund University Publications on Jun. 4, 2012.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9, 2006 Hawaii.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.
C. Liu et al., "Advanced Algorithm for MPPT Control of Photovoltaic Systems", Canadian Solar Buildings Conference, Montreal, Aug. 20-24, 2004.
Chihchiang Hua and Chihming Shen, "Study of Maximum Power Tracking Techniques and Control of DC/DC Converters for Photovoltaic Power System", IEEE 1998.

Tore Skjellnes et al., "Load sharing for parallel inverters without communication", Nordic Workshop in Power and Industrial Electronics, Aug. 12-14, 2002.
Giorgio Spiazzi at el., "A New Family of Zero-Current-Switching Variable Frequency dc-dc Converters", IEEE 2000.
Nayar, C.V., M. Ashari and W.W.L Keerthiphala, "A Grid Interactive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids—state of the art and future trends", 3rd World Conference on Photovoltaic Energy Conversion, Osaka, Japan May 11-18, 2003.
Nayar, C.V., abstract, Power Engineering Society Summer Meeting, 2000. IEEE, 2000, pp. 1280-1282 vol. 2.
D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática / Sep. 12-16, 2010, Bonito-MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—dated Mar. 26, 2013.
Supplementary European Search Report—EP08857456—dated Dec. 6, 2013.
Extended European Search Report—EP14151651.8—dated Feb. 25, 2014.
Iyomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved from the Internet: URL:http:ijscholar.lib.vt.edu/theses/available/etd-012299-165108/unrestricted/THESIS. PDF, [retrieved on Mar. 5, 2013].
Yoshida M et al: "Actual efficiency and electromagnetic noises evaluations of a single inductor resonant AC link snubber-assisted three-phase soft-switching inverter", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—Mailing date: Aug. 6, 2011.
Extended European Search Report—EP 13152967.9—dated Aug. 28, 2014.
Extended European Search Report—EP 14159696—dated Jun. 20, 2014.
Gow Ja A et al: "A Modular DC-DC Converter and Maximum Power Tracking Controller for Medium to Large Scale Photovoltaic Generating Plant" 8th European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.
Chihchiang Hua et al: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.
Matsuo H et al: "Novel Solar Cell Power Supply System Using the Multiple-input DC-DC Converter" 20th International telecommunications Energy Conference. Intelec '98 San

(56) References Cited

OTHER PUBLICATIONS

Francisco, CA, Oct. 4-8, 1998, Intelec International Telecommunications Energy Conference, New York, NY: IEEE, US, Oct. 4, 1998, pp. 797-802, XP000896384.

Chihchiang Hua et al: "DSP-based controller application in battery storage of photovoltaic system" Industrial Electronics, Control, and Instrumentation, 1996, Proceedings of the 1996 IEEE IECON 22nd International Conference on Taipei, Taiwan Aug. 5-10, 1996, New York, NY, USA, IEEE, US, Aug. 5, 1996, pp. 1705-1710, XP010203239.

Hua C et al: "Implementation of a DSP-Controlled Photovoltaic System with Peak Power Tracking" IEEE Transactions on industrial Electronics, IEEE, Inc. New York, US, vol. 45, No. 1, Feb. 1, 1998, pp. 99-107, XP000735209.

I. Weiss et al.: "A new PV system technology—the development of a magnetic power transmission from the PV module to the power bus" 16th European Photovoltaic Solar Energy Conference, vol. III, May 1-5, 2000, pp. 2096-2099, XP002193468 Glasgow,UK cited in the application.

Basso, Tim, "IEEE Standard for Interconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Gautam, Nalin K. et al., "An Efficient Algorithm to Simulate the Electrical Performance of Solar Photovoltaic Arrays," Energy, vol. 27, No. 4, pp. 347-361, 2002.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Wiles, John, "Photovoltaic Power Systems and the National Electrical Code: Suggested Practices," Sandia National Laboratories, document No. SAND2001-0674, Mar. 2001.

Hewes, J. "Relays," located at http://web.archive.org/web/20030816010159/www.kpsec.freeuk.com/components/relay.htm, Aug. 16, 2003.

Definition of "remove" from Webster's Third New International Dictionary, Unabridged, 1993.

Definition of "removable" from Webster's Third New International Dictionary, Unabridged, 1993.

Advanced Energy Group, "The Basics of Solar Power Systems," located at http://web.archive.org/web/20010331044156/http://www.solar4power.com/solar-power-basics.html, Mar. 31, 2001.

International Patent Application No. PCT/AU2005/001017, International Search Report and Written Opinion, dated Aug. 18, 2005.

Baek, Ju-Won et al., "High Boost Converter using Voltage Multiplier," 2005 IEEE Conference, IECON 05, pp. 567-572, Nov. 2005.

Wikimedia Foundation, Inc., "Electric Power Transmission," located at http://web.archive.org/web/20041210095723/en.wikipedia.org/wiki/Electric-power-transmission, Nov. 17, 2004.

Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.

Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.

Storfer, Lior, "Enhancing Cable Modem TCP Performance," Texas Instruments Inc. white paper, Jul. 2003.

Philips Semiconductors, Data Sheet PSMN005-55B; PSMN005-55P N-channel logic trenchMOS transistor, Oct. 1999, Product specification, pp. 1-11.

International Preliminary Report on Patentability Issued in corresponding international application No. PCT/US04/16668, filed May 27, 2004.

International Application No. PCT/US13/27965, International Preliminary Examination Report, dated Sep. 2, 2014.

International Patent Application PCT/US13/027965, International Search Report and Written Opinion, dated Jun. 2, 2013.

International Application No. PCT/US12/44045, International Preliminary Examination Report, dated Jan. 28, 2014.

International Patent Application No. PCT/US2012/044045, International Search Report and Written Opinion, dated Jan. 2, 2013.

International Patent Application No. PCT/US2009/047734, International Search Report and Written Opinion, dated May 4, 2010.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

International Patent Application No. PCT/US2010/029929, International Search Report and Written Opinion, dated Oct. 27, 2010.

Lowe, Electronics Basis: What is a Latch Circuit, http://www.dummies.com/how-to/content/electronics-basics-what-is-a-latch-circuit.html, from Electronics All-in-One for Dummies, Feb. 2012, downloaded Jul. 13, 2014.

International Patent Application No. PCT/US2011/020591, International Search Report and Written Opinion, dated Aug. 8, 2011.

International Patent Application No. PCT/US2011/033544, International Search Report and Written Opinion, dated Nov. 24, 2011.

J. Keller and B. Kroposki, titled, "Understanding Fault Characteristics of Inverter-Based Distributed Energy Resources", in a Technical Report NREL/TP-550-46698, published Jan. 2010, pp. 1 through 48.

International Patent Application No. PCT/US2008/081827, International Search Report and Written Opinion, dated Jun. 24, 2009.

International Patent Application No. PCT/US2010/046274 International Search Report and Written Opinion, dated Apr. 22, 2011.

International Patent Application No. PCT/US2011/033658, International Search Report and Written Opinion, dated Jan. 13, 2012.

International Patent Application No. PCT/US2011/029392, International Search Report and Written Opinion, dated Oct. 24, 2011.

European Patent Application No. 09829487.9, Extended Search Report, dated Apr. 21, 2011.

International Patent Application No. PCT/US2009/062536, International Search Report and Written Opinion, dated Jun. 17, 2010.

International Patent Application No. PCT/US2010/022915, International Search Report and Written Opinion, dated Aug. 23, 2010.

International Patent Application No. PCT/US2010/046272, International Search Report and Written Opinion, dated Mar. 31, 2011.

Exell et al., "The Design and Development of a Solar Powered Refrigerator", [retrieved on Feb. 13, 2013], Retrieved from the Internet <URL: http://www.appropedia.org/The_Design_and_Development_of_a_Solar_Powered_Refrigerator>, pp. 1-64.

"Development of Water-Lithium Bromide Low-Temperature Absorption Refridgerating Machine", 2002 Energy & Environment on Database on Noteworthy contributions for Science and Technology (Japan), Research Data (No. 1748) [online], [retrieved on Aug. 29, 2012]. Retrieved from the Internet: <URL: http://dbnstl.nii.ac.jp/english/detail/1748>, pp. 1-4.

Dictionary.com, "air conditioning" [online], [retrieved on Aug. 28, 2012]. Retrieved from the Internet: <URL: http://dictionary.reference.com/browse/air+conditioning?s=t>, pp. 1-3.

International Patent Application No. PCT/US2010/029936, International Search Report and Written Opinion, dated Nov. 12, 2010.

International Patent Application No. PCT/US08/75127, International Search Report and Written Opinion, dated Apr. 28, 2009.

International Patent Application No. PCT/US09/35890, International Search Report and Written Opinion, dated Oct. 1, 2009.

European Patent Application No. 08845104.2, Extended Search Report, dated Jul. 31, 2014.

European Patent Application No. 11772811.3, Extended Search Report, dated Dec. 15, 2014.

International Patent Application No. PCT/US2008/082935, International Search Report and Written Opinion, dated Jun. 25, 2009.

Bhatnagar et al., Silicon Carbide High Voltage (400 V) Shottky Barrier Diodes, IEEE Electron Device Letters, vol. 13 (10) p. 501-503 Oct. 10, 1992.

Rodriguez, C., and G. A. J. Amaratunga. "Dynamic stability of grid-connected photovoltaic systems." Power Engineering Society General Meeting, 2004. IEEE, pp. 2194-2200.

Kikuchi, Naoto, et al. "Single phase amplitude modulation inverter for utility interaction photovoltaic system." Industrial Electronics

(56) References Cited

OTHER PUBLICATIONS

Society, 1999. IECON'99 Proceedings. The 25th Annual Conference of the IEEE. vol. 1. IEEE, 1999.
Nonaka, Sakutaro, et al. "Interconnection system with single phase IGBT PWM CSI between photovoltaic arrays and the utility line." Industry Applications Society Annual Meeting, 1990., Conference Record of the 1990 IEEE.
Calais, Martina, et al. "Inverters for single-phase grid connected photovoltaic systems—an overview." Power Electronics Specialists Conference, 2002. pesc 02. 2002 IEEE 33rd Annual. vol. 4. IEEE, 2002.
Marra, Enes Goncalves, and José Antenor Pomilio. "Self-excited induction generator controlled by a VS-PWM bidirectional converter for rural applications." Industry Applications, IEEE Transactions on 35.4 (1999): 877-883.
Xiaofeng Sun, Weiyang Wu, Xin Li, Qinglin Zhao: A Research on Photovoltaic Energy Controlling System with Maximum Power Point Tracking:; Proceedings of the Power Conversion Conference—Osaka 2002 (Cat. No. 02TH8579) IEEE—Piscataway, NJ, USA, ISBN 0-7803-7156-9, vol. 2, p. 822-826, XP010590259: the whole document.
International Search Report for corresponding PCT/GB2005/050198 completed Jun. 28, 2006 by C. Wirner of the EPO.
Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.
Cordonnier, Charles-Edouard, et al., "Application Considerations for Sensefet Power Devices," PCI Proceedings, May 11, 1987, pp. 47-65.
Kotsopoulos, Andrew, et al., "Predictive DC Voltage Control of Single-Phase PV Inverters with Small DC Link Capacitance," IEEE International Symposium, Month Unknown, 2003, pp. 793-797.
Meinhardt, Mike, et al., "Multi-String-Converter with Reduced Specific Costs and Enhanced Functionality," Solar Energy, May 21, 2001, pp. 217-227, vol. 69, Elsevier Science Ltd.
Kimball, et al.: "Analysis and Design of Switched Capacitor Converters"; Grainger Center for Electric Machinery and Electromechanics, University of Illinois at Urbana-Champaign, 1406 W. Green St, Urbana, IL 61801 USA, © 2005 IEEE; pp. 1473-1477.
Martins, et al.: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.
International Search Report for corresponding PCT/GB2005/050197, completed Dec. 20, 2005 by K-R Zettler of the EPO.
Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.
Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference, Month Unknown, 2002, pp. 1483-1488, vol. 3, IEEE.
Written Opinion of PCT/GB2005/050197, dated Feb. 14, 2006, Enecsys Limited.
Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.
Mar. 2, 2021—CN Office Action—CN 201810409651.4.
Chinese Office Action—CN Appl. 201310035221.8—dated Aug. 11, 2016.
Zhou, Wilson and Theo Phillips—"Industry's First 4-Switch Buck-Boost Controller Achieves Highest Efficiency Using a Single Inducutor—Design Note 369"—Linear Technology Corporation—www.linear.com—2005.

"Micropower Synchronous Buck-Boost DC/DC Converter"—Linear Technology Corporation—www.linear.com/LTC3440—2001.
Caricchi, F. et al—20 kW Water-Cooled Prototype of a Buck-Boost Bidirectional DC-DC Converter Topology for Electrical Vehicle Motor Drives—University of Rome—IEEE 1995—pp. 887-892.
Roy, Arunanshu et al—"Battery Charger using Bicycle"—EE318 Electronic Design Lab Project Report, EE Dept, IIT Bombay, Apr. 2006.
Jun. 20-25, 2004—Viswanathan, K. et al—Dual-Mode Control of Cascade Buck-Boost PFC Converter—35th Annual IEEE Power Electronics Specialists Conference—Aachen, Germany, 2004.
Zhang, Pei et al.—"Hardware Design Experiences in ZebraNet"—Department of Electrical Engineering, Princeton University—SenSys '04, Nov. 3-5, 2004.
"High Efficiency, Synchronous, 4-Switch Buck-Boost Controller"—Linear Technology Corporation—www.linear.com/LTC3780—2005.
Chomsuwan, Komkrit et al. "Photovoltaic Grid-Connected Inverter Using Two-Switch Buck-Boost Converter"—Department of Electrical Engineering, King Mongkut's Institute of Technology Ladkrabang, Thailand, National Science and Technology Development Agency, Thailand—IEEE—2002.
Midya, Pallab et al.—"Buck or Boost Tracking Power Converter"—IEEE Power Electronics Letters, vol. 2, No. 4—Dec. 2004.
Chinese Office Action—CN Appl. 201510111948.9—dated Sep. 14, 2016.
Chinese Office Action—CN Appl. 201310066888.4—dated Nov. 2, 2016.
"Power-Switching Converters—the Principle, Simulation and Design of the Switching Power (the Second Edition)", Ang, Oliva, et al., translated by Xu Dehong, et al., China Machine Press, Aug. 2010, earlier publication 2005.
European Notice of Opposition—EP Patent 2092625—mailed Nov. 29, 2016.
Mar. 8, 2003—Vishay Siliconix "Si 7884DP—n-Channel 40-V (D-S) MOSFET" (2003).
Chinese Office Action—CN 201510423458.2—dated Jan. 3, 2017 (english translation provided).
Chinese Office Action—CN 201410098154.9—dated Mar. 3, 2017 (english translation provided).
European Search Report—EP Appl. 13150911.9—dated Apr. 7, 2017.
Howard et al, "Relaxation on a Mesh: a Formalism for Generalized Localization." Proceedings of the IEEE/RSJ International Conference on Intelligent Robots and Systems (IROS 2001). Wailea, Hawaii, Oct. 2001.
Chinese Office Action and Search Report—CN 201510578586.4—dated Apr. 19, 2017.
Jul. 13, 2017—Chinese Office Action—CN201210007491.3.
Jul. 31, 2014—Huimin Zhou et al.—"PV Balancers: Concept, Architectures, and Realization"—IEEE Transactions on Power Electronics, vol. 30, No. 7, pp. 3479-3487.
Sep. 15, 2012—Huimin Zhou et. al—"PV balancers: Concept, architectures, and realization"—Energy Conversion Congress and Exposition (ECCE), 2012 IEEE, IEEE pp. 3749-3755.
Jul. 17, 2017—International Search Report—PCT/US2017/031571.
Aug. 4, 2017—European Search Report—EP 17165027.
Jul. 19, 2016—Notice of Opposition—EP 2374190—EP App No. 08878650.4.
Nov. 29, 2017—EP Notification of Oral Proceedings; EP App No. 13800859.4.
Ciobotaru, et al., Control of single-stage single-phase PV inverter, Aug. 7, 2006.
International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Conference, Feb. 2001, Colorado Power Electronics Center Publications.

(56) References Cited

OTHER PUBLICATIONS

Chen, et al., "Buck-Boost PWM Converters Having Two Independently Controlled Switches", IEEE Power Electronics Specialists Conference, Jun. 2001, Colorado Power Electronics Center Publications.

Esram, et al., "Comparison of Photovoltaic Array Maximum Power Point Tracking Techniques", IEEE Transactions on Energy Conversion, vol. 22, No. 2, Jun. 2007, pp. 439-449.

Walker, et al., "Photovoltaic DC-DC Module Integrated Converter for Novel Cascaded and Bypass Grid Connection Topologies-Design and Optimisation", 37th IEEE Power Electronics Specialists Conference, Jun. 18-22, 2006, Jeju, Korea.

Geoffrey R. Walker Affidavit re: U.S. Appl. No. 11/950,307, submitted in an IDS for U.S. Appl. No. 11/950,271 on Mar. 9, 2010.

Geoffrey R. Walker Affidavit re: U.S. Appl. No. 11/950,271, submitted in an IDS for U.S. Appl. No. 11/950,271 on Mar. 9, 2010.

International Search Report for PCT/IB2007/004610 dated Feb. 23, 2009.

International Search Report for PCT/IB2007/004584 dated Jan. 28, 2009.

International Search Report for PCT/IB2007/004586 dated Mar. 5, 2009.

International Search Report for PCT/IB2007/004643 dated Jan. 30, 2009.

International Search Report for PCT/US2008/085736 dated Jan. 28, 2009.

International Search Report for PCT/US2008/085754 dated Feb. 9, 2009.

International Search Report for PCT/US2008/085755 dated Feb. 3, 2009.

Kajihara, et al., "Model of Photovoltaic Cell Circuits Under Partial Shading", 2005 IEEE, pp. 866-870.

Knaupp, et al., "Operation of a 10 KW PV Façade with 100 W AC Photovoltaic Modules", 1996 IEEE, 25th PVSC, May 13-17, 1996, pp. 1235-1238, Washington, DC.

Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.

Chen, et al., "Predictive Digital Current Programmed Control", IEEE Transactions on Power Electronics, vol. 18, Issue 1, Jan. 2003.

Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.

Alonso, "A New Distributed Converter Interface for PV Panels", 20th European Photovoltaic Solar Energy Conference, Jun. 6-10, 2005, Barcelona, Spain, pp. 2288-2291.

Alonso, "Experimental Results of Intelligent PV Module for Grid-Connected PV Systems", 21st European Photovoltaic Solar Energy Conference, Sep. 4-8, 2006, Dresden, Germany, pp. 2297-2300.

Enslin, "Integrated Photovoltaic Maximum Power Point Tracking Converter", IEEE Transactions on Industrial Electronics, vol. 44, No. 6, Dec. 1997, pp. 769-773.

Sep. 7-9, 1999—Lindgren, "Topology for Decentralised Solar Energy Inverters with a Low Voltage AC-Bus", Chalmers University of Technology, Department of Electrical Power Engineering, EPE '99—Lausanne.

Nikraz, "Digital Control of a Voltage Source Inverter in a Photovoltaic Applications", 2004 35th Annual IEEE Power Electronics Specialists Conference, Aachen, Germany, 2004, pp. 3266-3271.

Orduz, "Evaluation Test Results of a New Distributed MPPT Converter", 22nd European Photovoltaic Solar Energy Conference, Sep. 3-7, 2007, Milan, Italy.

Palma, "A Modular Fuel Cell, Modular DC-DC Converter Concept for High Performance and Enhanced Reliability", IEEE 2007, pp. 2633-2638.

Sep. 16-19, 1996—Quaschning, "Cost Effectiveness of Shadow Tolerant Photovoltaic Systems", Berlin University of Technology, Institute of Electrical Energy Technology, Renewable Energy Section. EuroSun '96, pp. 819-824.

Roman, "Intelligent PV Module for Grid-Connected PV Systems", IEEE Transactions on Industrial Electronics, vol. 52, No. 4, Aug. 2006, pp. 1066-1073.

Roman, "Power Line Communications in Modular PV Systems", 20th European Photovoltaic Solar Energy Conference, Jun. 6-10, 2005, Barcelona, Spain, pp. 2249-2252.

Uriarte, "Energy Integrated Management System for PV Applications", 20th European Photovoltaic Solar Energy Conference, Jun. 6-10, 2005, Barcelona, Spain, pp. 2292-2295.

Walker, "Cascaded DC-DC Converter Connection of Photovoltaic Modules", IEEE Transactions on Power Electronics, vol. 19, No. 4, Jul. 2004, pp. 1130-1139.

Oct. 3-7, 1999—Matsui, et al., "A New Maximum Photovoltaic Power Tracking Control Scheme Based on Power Equilibrium at DC Link", IEEE, 1999, pp. 804-809.

Hou, et al., Application of Adaptive Algorithm of Solar Cell Battery Charger, Apr. 2004.

Stamenic, et al., "Maximum Power Point Tracking for Building Integrated Photovoltaic Ventilation Systems", 2000.

International Preliminary Report on Patentability for PCT/IB2008/055092 dated Jun. 8, 2010.

International Search Report for PCT/IB2008/055092 dated Sep. 8, 2009.

International Search Report and Opinion of International Patent Application WO2009136358 (PCT/IB2009/051831), dated Sep. 16, 2009.

Informal Comments to the International Search Report dated Dec. 3, 2009.

PCT/IB2010/052287 International Search Report and Written Opinion dated Sep. 2, 2010.

UK Intellectual Property office, Combined Search and Examination Report for GB1100450.4 under Sections 17 and 18 (3), dated Jul. 14, 2011.

Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.

Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.

Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.

Sandia Report SAND96-2797 I UC-1290 Unlimited Release, Printed Dec. 1996, "Photovoltaic Power Systems and The National Electrical Code: Suggested Practices", by John Wiles, Southwest Technology Development Institute New Mexico State University Las Cruces, NM.

United Kingdom Intellectual Property Office, Combined Search and Examination Report Under Sections 17 and 18(3), GB1020862.7, dated Jun. 16, 2011.

* cited by examiner

INTEGRATED PHOTOVOLTAIC PANEL CIRCUITRY

RELATED APPLICATIONS

This application claims priority to U.S. application Ser. No. 13/487,311, filed Jun. 4, 2012, entitled "Integrated Photovoltaic Panel Circuitry", the entire contents of which are incorporated herein by reference.

BACKGROUND

A photovoltaic panel or a solar panel is an interconnected assembly of solar cells and is the basic component of a photovoltaic system.

Manufacturers of photovoltaic panels specify electrical characteristics which may include maximum rated power, open circuit voltage, short circuit current, maximum power voltage, maximum power current, temperature coefficients and insulation resistance.

Insulation resistance testing may be carried out by shorting a positive terminal and a negative terminal of a solar panel, and then by applying a predetermined voltage between the live electrical section and the outer housing, backside, the frame, and ground terminals. Wet insulation testing of photovoltaic panels may include performing resistance measurement on the insulation of a photovoltaic panel immersed in a liquid solution bath. The insulation resistance test and wet insulation test verifies that the solar panel or the solar cell array has insulation high enough to reduce the possibility of fire and electrocution hazards.

An increase in maximum system voltage may place an extra burden on photovoltaic manufacturers with regard to insulation resistance. Further, photovoltaic modules can exhibit performance degradation in the field when subjected to high voltages at elevated temperatures in a humid climate. Given that increased system voltage may place an extra burden on panel manufacturers to provide better insulation, and given that increased maximum system voltage may be a cause of performance degradation of photovoltaic modules, there is a need for and it would be advantageous to have circuitry integrated with a photovoltaic panel which provides features to allow more photovoltaic panels to be wired serially in a string without needing higher insulation resistance of the photovoltaic panel and lower operating voltage operation of photovoltaic panels so as to increase long term lifetime of a photovoltaic system.

SUMMARY

Various circuits are disclosed which are integrated or integrable with a photovoltaic panel to provide built-in functionality to the photovoltaic panel.

According to various aspects disclosed herein, there is provided a photovoltaic module which may include a photovoltaic panel and an isolated converter circuit with a primary input connected to the photovoltaic panel and a secondary output galvanically isolated from the primary input. The primary input may be connectible to multiple input terminals within a junction box and at least one of the input terminals may be electrically connected to a ground.

The photovoltaic module may include multiple interconnected photovoltaic cells connected electrically to multiple connectors (for example bus-bars). The photovoltaic module may include input terminals operable for connecting to the connectors and an isolated converter circuit. The isolated converter circuit may include a primary input connected to the input terminals and a secondary output galvanically isolated from the primary input. The isolated converter circuit may convert DC power on the primary input to a DC power on the secondary output. A duty cycle of the isolated converter circuit may be adjustable to give a nominal voltage on the secondary output. The duty cycle of the isolated converter circuit may be adjustable to give an adjustable open circuit voltage across the secondary output. The isolated converter circuit may be a Cuk circuit, a buck circuit, a buck-boost circuit, a buck and boost circuit, a boost circuit, a full-bridge circuit, a half-bridge circuit, a push-pull circuit, a resonant forward circuit, a forward circuit, a half-forward circuit, a ringing choke converter or a flyback circuit.

The photovoltaic module may be galvanically isolated from the primary input. The secondary output may be a dual direct-current (DC) output or a single direct-current (DC) output. The primary input may be a dual direct-current (DC) input from the connectors (for example bus-bars) or a single direct-current (DC) input from the connectors. Both the primary input and the secondary output may be dual direct-current (DC) input and output respectively or may be a single direct-current (DC) input and output respectively. The primary input and the secondary output may be a single direct-current (DC) input and a dual direct-current (DC) output respectively or may be a dual direct-current (DC) input and a single direct-current (DC) output respectively.

According to various aspects, there is provided a power harvesting system which includes multiple photovoltaic cells, and/or panels. Multiple isolated converter circuit modules with respective primary inputs, which may be integrable with and electrically connectable to respective photovoltaic panels. The power harvesting system may further include multiple interconnected photovoltaic strings. Each photovoltaic string may be a series connection of secondary outputs of the isolated converter circuit modules and the secondary outputs may be galvanically isolated from the primary inputs. A duty cycle of the isolated converter circuit modules may be adjustable to give an adjustable nominal voltage across the interconnected photovoltaic strings. A load may also be connected across the photovoltaic strings. The load may be a DC to alternating current (AC) inverter, a three-level DC to AC inverter, a grid tied DC to AC inverter, a DC battery, a DC motor or a DC to DC converter input.

According to various aspects, there is provided a method to reduce the voltage rating of a serial connection of photovoltaic panels in a solar power harvesting system. The method connects multiple primary input terminals of respective power converters to the connectors (for example bus-bars) of respective photovoltaic panels. Multiple secondary output terminals of the power converters are connected together to provide the serial connection. The secondary output terminals are galvanically isolated from the primary input terminals.

According to various aspects, there is provided a method for providing an adjustable open circuit voltage at the output terminals of a photovoltaic module. The method connects primary input terminals of a power converter to the connectors (for example bus-bars) of the photovoltaic panel. Power on the primary input terminals may be converted to an output power on secondary output terminals of the power converter. A duty cycle of the power converter may be adjusted to set and adjust an open circuit voltage across the secondary output terminals.

DESCRIPTION OF THE DRAWINGS

Various embodiments are herein described, by way of example only, with reference to the accompanying drawings, wherein:

FIG. 2b which shows a plan view the photovoltaic panel shown in FIG. 2a.

DETAILED DESCRIPTION

Figure 1:
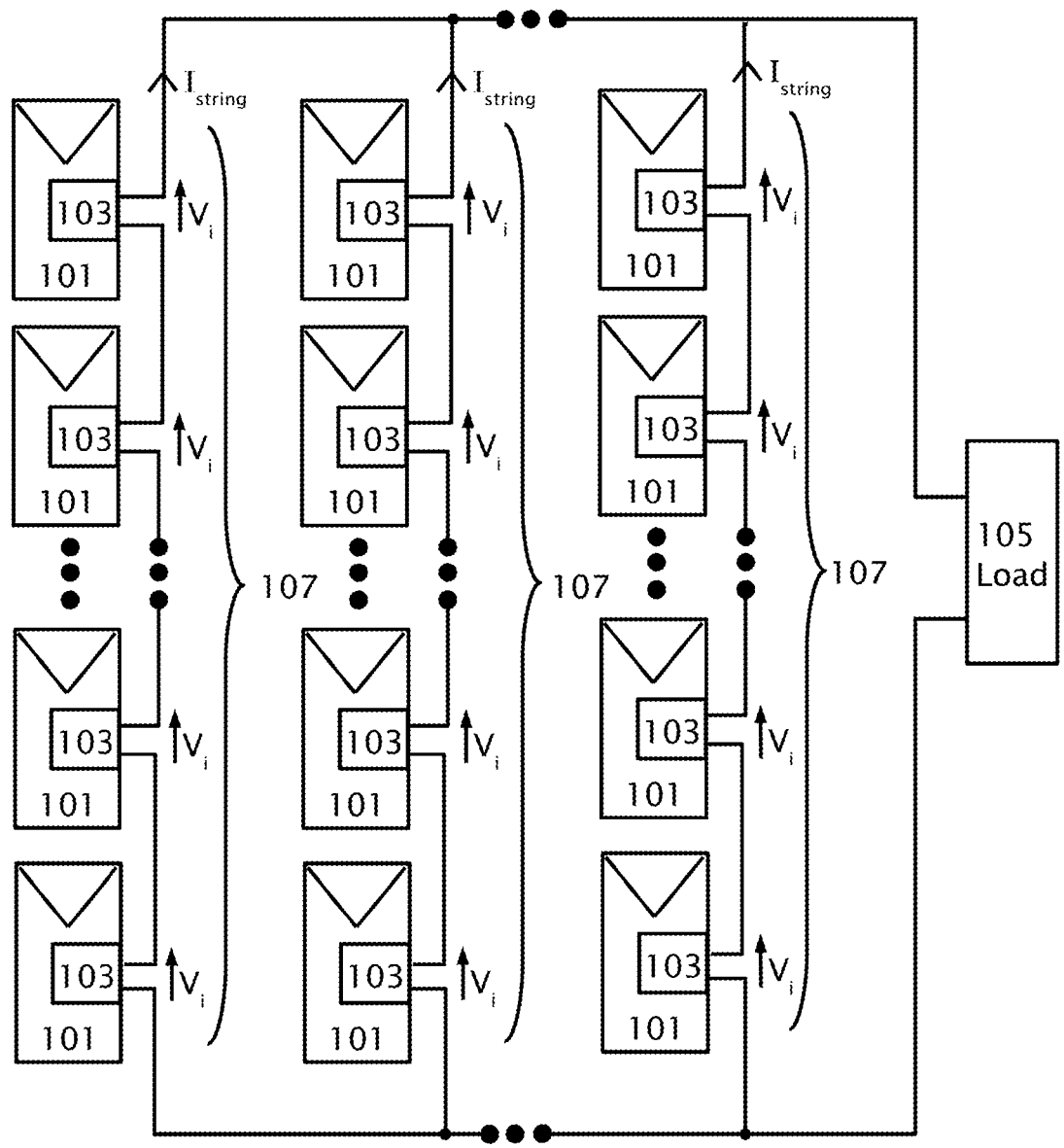
FIG. 1 illustrates a photovoltaic solar power harvesting system, illustrating features of various embodiments.

Reference will now be made in detail to features of various embodiments, examples of which are illustrated in the accompanying drawings, wherein like reference numerals refer to the like elements throughout. The features are described below to explain various embodiments by referring to the figures.

Before explaining various aspects in detail, it is to be understood that embodiments are not limited in their application to the details of design and the arrangement of the components set forth in the following description or illustrated in the drawings. Embodiments are capable of other features or of being practiced or carried out in various ways. Also, it is to be understood that the phraseology and terminology employed herein is for the purpose of description and should not be regarded as limiting.

It should be noted, that although the discussion herein relates primarily to photovoltaic systems, various embodiments may, by non-limiting example, alternatively be configured using other distributed power systems including (but not limited to) wind turbines, hydro turbines, fuel cells, storage systems such as battery, super-conducting flywheel, and capacitors, and mechanical devices including conventional and variable speed diesel engines, Stirling engines, gas turbines, and micro-turbines.

By way of introduction, various aspects are directed to circuitry integrated or integrable with a photovoltaic panel to form a photovoltaic module. The circuitry allows for galvanic isolation between the photovoltaic panel and the output of the circuitry.

According to an illustrative feature of various embodiments, the circuit is connected or connectible at the input terminals to a photovoltaic panel. The output terminals may be connected to form a string of photovoltaic modules. Multiple photovoltaic modules may be parallel connected to form the photovoltaic solar power harvesting system The term "switch" as used herein may refer in various embodiments to an active semiconductor switch, e.g. a field effect transistor (FET), in which a controllable and/or variable voltage or current is applied to a control terminal, e.g. gate, of the switch which determines the amount current flowing between the poles of the switch, e.g. source and drain of the FET.

The term "activate" a switch as used herein may refer to opening, closing and/or toggling i.e. alternatively opening and closing the switch.

The term "galvanic isolation" as used herein is a way of isolating functional sections of electrical circuits and/or systems from the movement of charge-carrying particles from one section of an electrical circuit and/or a system to another. That is, there is no direct current between the functional sections of electrical circuits and/or systems. Energy or information, however, can still be exchanged between the sections of electrical circuits and/or systems by other means, e.g. capacitance, mutual inductance or electromagnetic waves, or by optical, acoustic or mechanical means.

The term "dual DC" input or output may refer in various embodiments to positive and negative terminals referenced to each other and referenced to a third terminal, such as ground potential, electrical ground or a neutral of an alternating current (AC) supply which may be connected to electrical ground at some point.

The term "single DC" input or output refers to positive and negative terminals referenced to each other, but not referenced or connected to a ground potential, electrical ground or a neutral of an alternating current (AC) supply, unless one of the terminals is coupled to a reference.

The term "two-level inverter" as used herein, refers to and inverter having an AC phase output having two voltage levels with respect to a negative terminal. The negative terminal is common to the AC phase output and the direct current (DC) input of the two-level inverter. The alternating current (AC) phase output of the two-level inverter may be a single phase output a two phase output or a three phase output. Therefore, the single phase output has two voltage levels with respect to the negative terminal. The two phase output has two voltage levels with respect to the negative terminal for each of two phases. The three phase output has two voltage levels with respect to the negative terminal for each of three phases.

Similarly, the term "three-level inverter" as used herein refers to and inverter having an alternating current (AC) phase output having three voltage levels. The AC phase output has three voltage levels with respect to a negative terminal. The negative terminal may be common to the AC phase output and the direct current (DC) input of the three-level inverter. The alternating current (AC) phase output of the three-level inverter may be a single phase output, a two phase output, or a three phase output. Therefore, the single phase output has three voltage levels with respect to the negative terminal. The two phase output has three voltage levels with respect to the negative terminal for each of the two phases. The three phase output has three voltage levels with respect to the negative terminal for each of the three phases.

The three-level inverter compared with the two-level inverter may have a cleaner AC output waveform, may use smaller size magnetic components and may have lower losses in power switches, since more efficient lower voltage devices may be used. Three-level inverter circuits may have dual (positive and negative) direct current (DC) inputs.

Reference is now made to FIG. 1 of a photovoltaic solar power harvesting system 10, illustrating various aspects. Power harvesting system 10 includes multiple photovoltaic panels 101 connected respectively to multiple junction boxes 103 to form multiple photovoltaic modules. Junction box 103 may provide electrical input terminals and mechanical support for bus-bars a, b and c (not shown), which may be used as an input to junction box 103 from panel 101. Junction box 103 may be attachable and/or re-attachable to panel 101 or may be permanently attachable to panel 101 using for example a thermoset adhesive, e.g. an epoxy adhesive, screws, or other mechanical attachment. The electrical voltage outputs ($V_i$) at output terminals of junction boxes 103 may be connected in series to form a series photovoltaic serial string 107 through which a string current ($I_{string}$) may flow. Multiple strings 107 may be connected in parallel and across an input of a load 105. $V_i$ and $I_{string}$ may be different for every photovoltaic module and string 107, respectively. Load 105 may be a direct current (DC) load such as a DC motor, a battery, an input to a DC to DC converter, or a DC input to a DC to AC inverter.

Figure 2A:
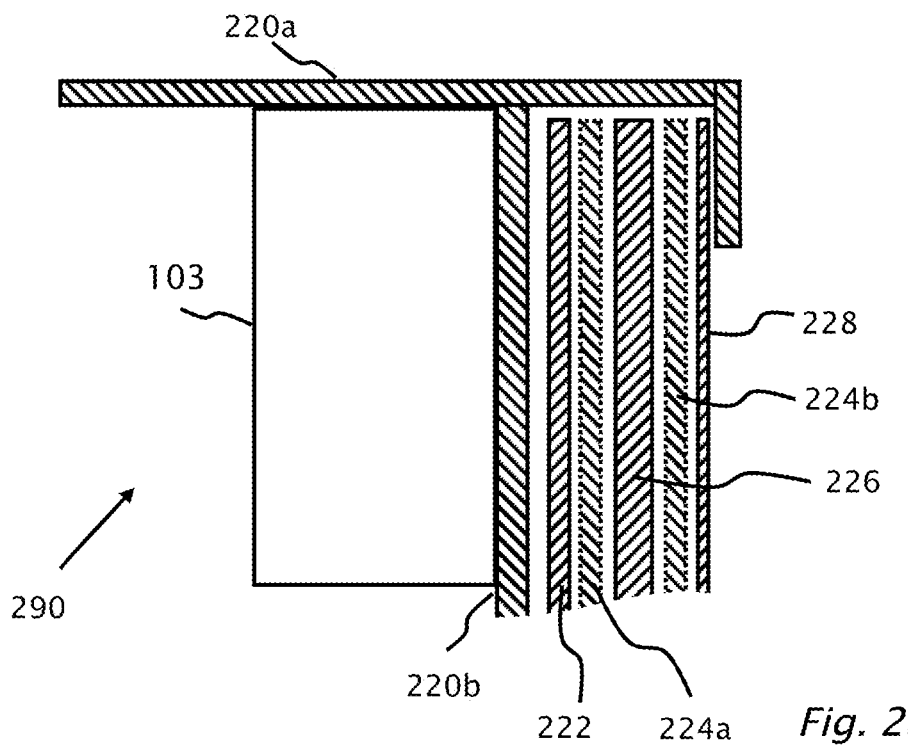
FIG. 2a shows a cross section of a photovoltaic panel.
Figure 2B:
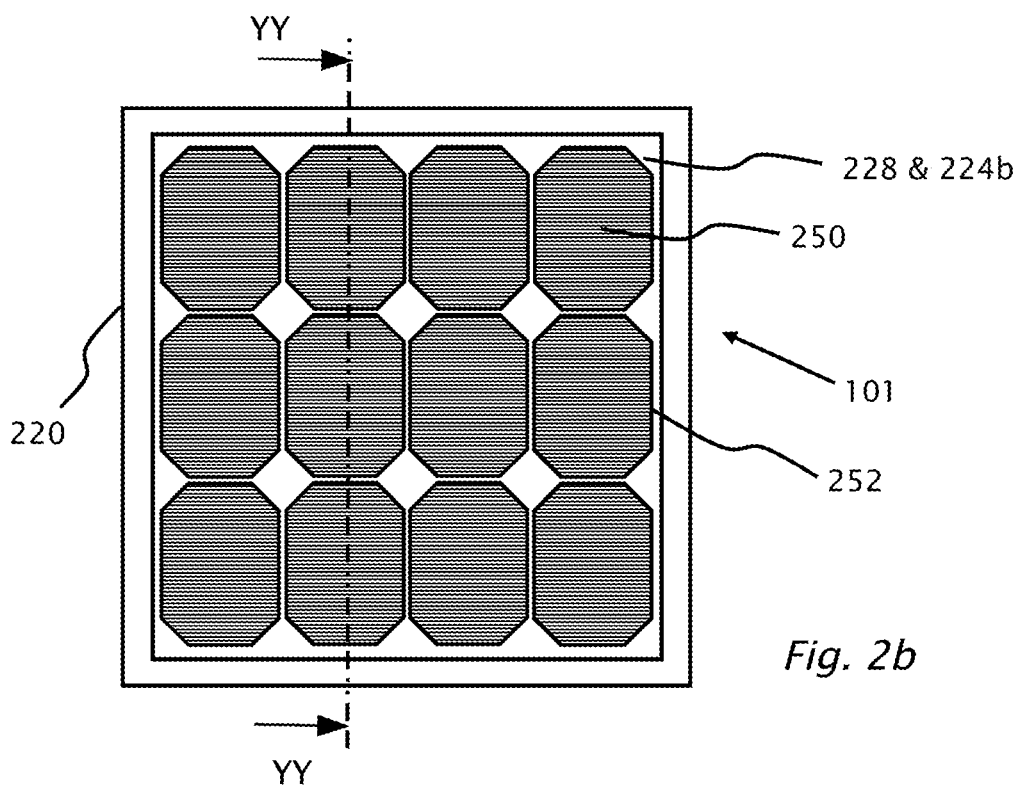

Reference is now made to FIG. 2b, which shows a plan view photovoltaic panel 101. The plan view shows casing 220 and photovoltaic cells 252 with tracks 250 showing through transparent glass 228 and sheet 224b.

Reference is now made to FIG. 2a which shows a partial cross section 290 of section YY shown in FIG. 2b for a photovoltaic panel 101. The partial cross section is located near a side 220a of casing 220. Side 220a is located at the perimeter of casing 220 as illustrated in FIG. 2b. Casing 220 includes a back 220b and four sides 220a. Casing 220 may be fabricated using a metal alloy, aluminum, stainless steel, plastic or other material having sufficient strength to house the panel components. Casing 220 may hold together a sandwich of various sheets. Nearest to back 220b is an insulating sheet 222. Next to insulating sheet 222 is a reactive encapsulant sheet 224a. Encapsulant sheet 224a may be made from a polymer, e.g., ethylene vinyl acetate (EVA) polymer, polyvinyl-butyral (PVB), etc. Next to reactive encapsulant sheet 224a is a photovoltaic substrate 226 followed by another reactive encapsulant sheet 224b, that may be transparent. Encapsulant sheet 224b may be made out of the same or similar material as 224a. Finally after reactive encapsulant sheet 224b is a sheet of low iron flat glass 228. The side (i.e., surface) of photovoltaic substrate 226 adjacent to reactive encapsulant sheet 224b is where the metal tracks 250 (not shown) may be located. Metal tracks 250 connect electrically the photovoltaic cells 252 (not shown) of photovoltaic substrate 226. Junction box 103 may be mounted on back 220b and bus-bars a, b and c (not shown) may terminate inside junction box 103 and connect to tracks 250. In other embodiments, junction box 103 is mounted separate from panel 101.

Figure 3A:
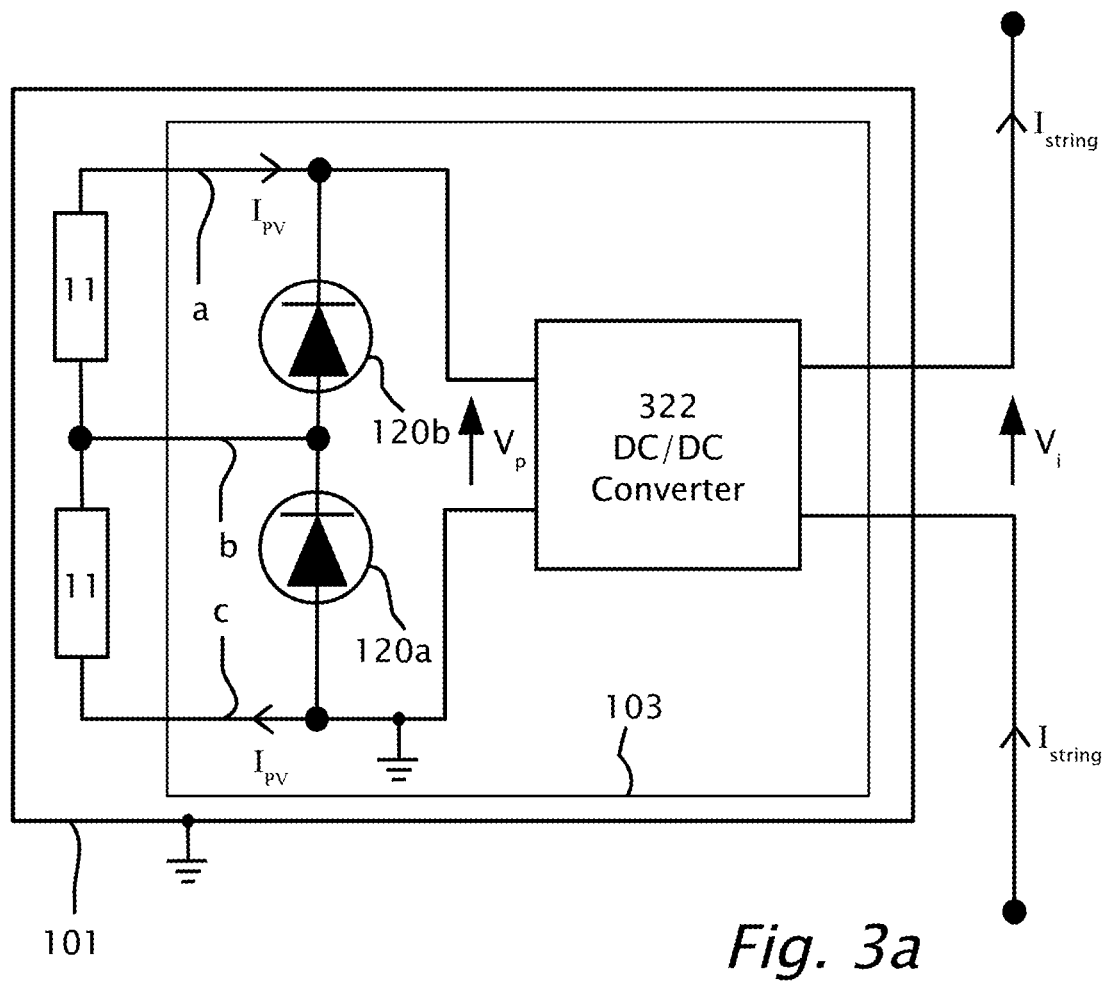
FIG. 3a shows details of a circuit and a photovoltaic panel shown in FIG. 1, according to an illustrative embodiment.

Reference is now made to FIG. 3a which shows more details of junction box 103 and photovoltaic panel 101 shown in FIG. 1, according to an illustrative feature. According to the example, photovoltaic panel 101 includes two sub-strings 11 of serially connected photovoltaic cells which output to bus-bars a, b and c which are the input terminals to junction box 103. Sub-strings 11 may include one or more cells. The input of junction box 103 may include two bypass diodes 120a and 120b with anodes connected respectively to bus-bars c and b and cathodes connected respectively to bus-bars a and b. Connected across bus-bars a and c is the input to a direct current (DC) to DC converter 322. When sub-strings 11 are illuminated, the current into converter 322 is substantially that of current $I_{PV}$ flowing from strings 11 and the voltage $V_P$ input to converter 322 is the voltage across bus-bars a and c. The output of converter 322 is $V_i$ and the output of a converter 322 may be placed in series with other panels 101 and/or junction boxes 103 to form a string 107 as shown in FIG. 1.

Figure 3B:
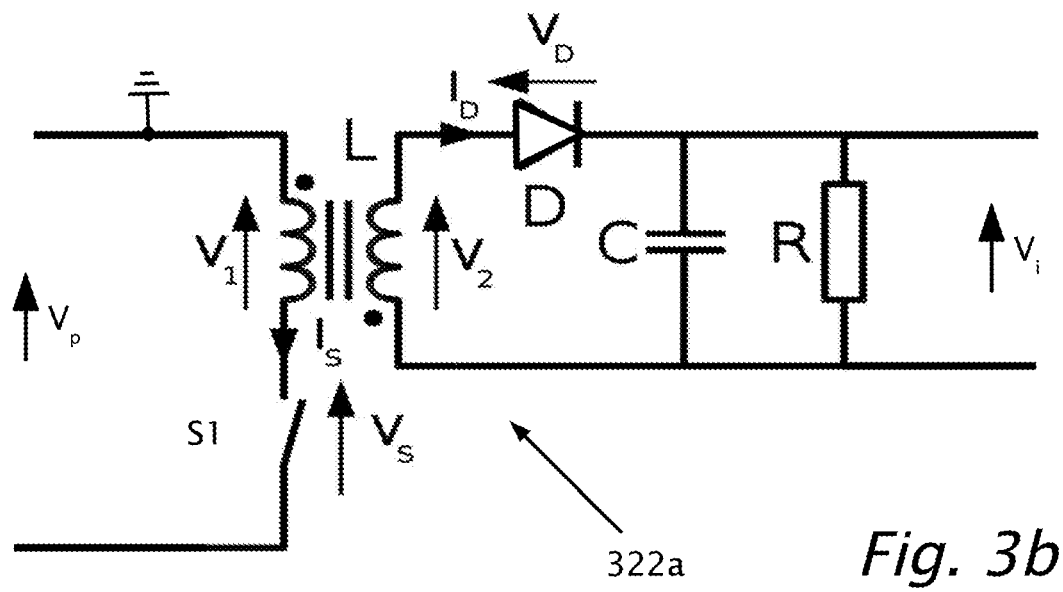
FIGS. 3b and 3c show two illustrative circuits for a DC/DC converter shown in FIG. 3a which are operable by a controller.
Figure 3C:
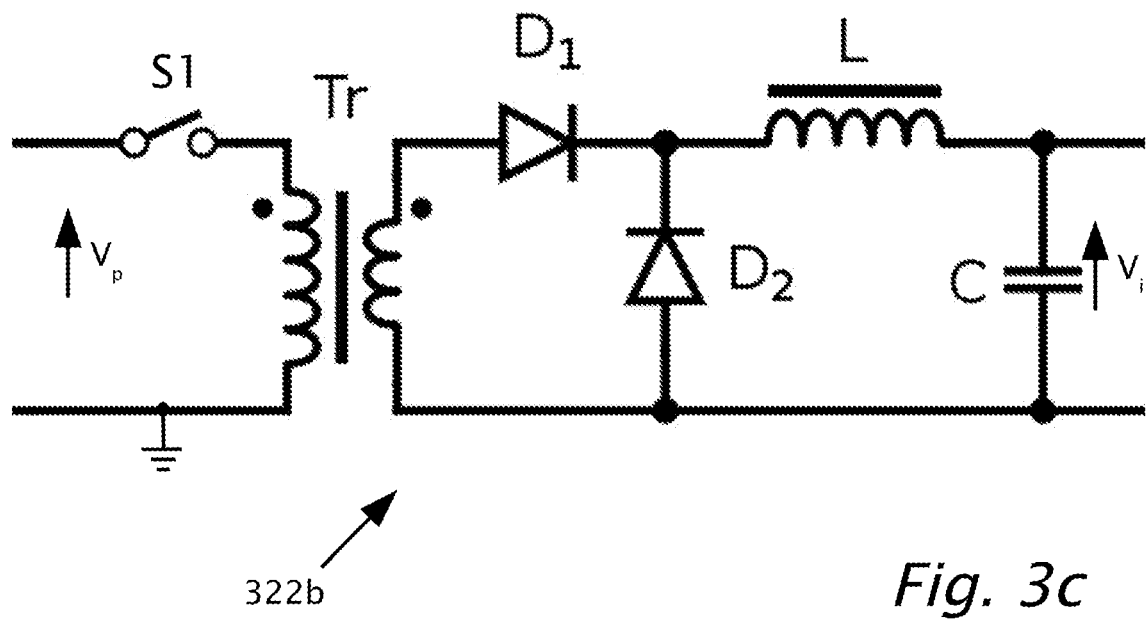

Reference is now made to FIGS. 3b and 3c which show implementations of converter 322 shown in FIG. 3a, according to various embodiments. Both FIGS. 3b and 3c are isolating DC to DC converters shown by converter circuits 322a and 322b respectively. Converters 322a and 322b have primary inputs ($V_P$) which may be connected across a panel 101 as shown in FIG. 3a and secondary outputs ($V_i$) which may be connected in series to form a serial string 107 as shown in FIG. 1.

Converter 322a has a single switch S1 wired in series with a primary side of a mutual inductor L. The secondary side of inductor L is wired in series with a diode D. The anode of diode D may be connected to one end of inductor L and the cathode of diode D may be connected to the positive voltage terminal of secondary output Vi. The other end of inductor L not connected to diode D may be connected to the negative terminal of secondary output Vi. A resistor R and capacitor C may be wired in parallel across the secondary output $V_i$. In an alternate version, the cathode of diode D may be connected to one end of inductor L, the anode of diode D may be connected to the negative terminal of secondary output Vi, and the other end of inductor L not connected to diode D may be connected the positive terminal of secondary output Vi. A resistor R and capacitor C may be wired in parallel across secondary output $V_i$ in the alternate version.

Converter 322a may be an isolating buck-boost converter with the inductor (L) split to form a transformer, so that voltage ratios of $V_1$ and $V_2$ are multiplied as well as having galvanic isolation between primary input $V_P$ and secondary output $V_i$.

Converter 322b may have a single switch S1 wired in series with a primary side of a transformer Tr. Again transformer Tr provides galvanic isolation between primary input $V_P$ and secondary output $V_i$. One end of the secondary winding of transformer Tr may connect to the anode of a diode D1 and the cathode of D1 may connect to one end of an inductor L. The other end of inductor L may be connected to the positive voltage terminal of secondary output $V_i$. The other end of the secondary winding may be connected to the negative voltage terminal of secondary output $V_i$. The other end of the secondary winding may connect to the anode of diode D2 and the cathode of D2 may connect to the cathode of diode D1. A capacitor C may be connected across secondary output $V_i$. Other variation of converter 322b may be used with D1, D2, L and C used in various other arrangements to provide the same output Vi Converter 322b may be a forward converter and performs the same function of converter 322a and may be more energy efficient than converter 322a. Numerous other isolated DC to DC converter topologies may be used with respect to converter 322, for example, ringing choke converter, resonant forward, half-bridge and full-bridge converters. A feature of DC to DC converters may be an adjustable duty cycle for conversion of DC power. Converters 322a and 322b, therefore, may be adjusted to give an adjustable desired open circuit voltage across secondary output $V_i$ prior to connection in a string 107.

Figure 3D:
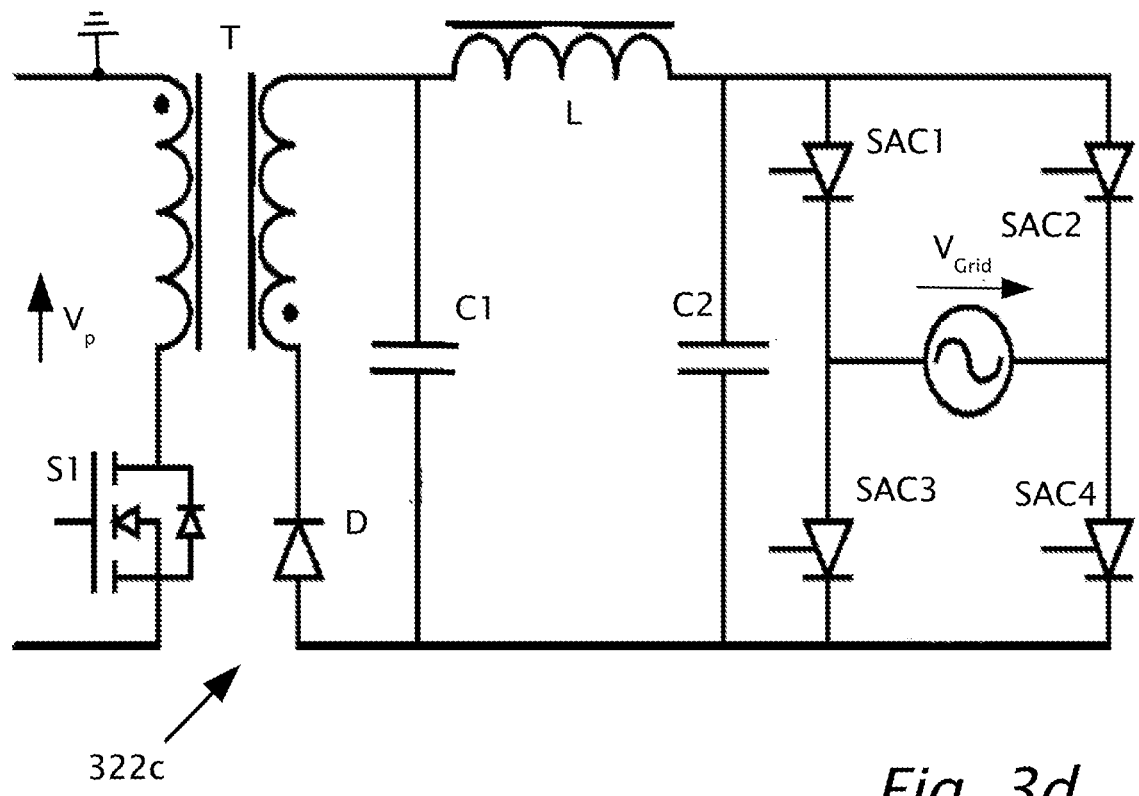
FIG. 3d shows an isolating DC to alternating current (AC) inverter, according to an illustrative embodiment.

Reference is now made to FIG. 3d which shows an isolating DC to alternating current (AC) isolating inverter 322c, according to an illustrative feature. A switch S1 may be wired in series with the primary side of a transformer T. In some variations, switch S1 may be a metal oxide semiconductor field effect transistor (MOSFET). A DC voltage ($V_P$) may be applied across the source of switch S1 and one side of primary coil T. The other side of primary coil T may be connected to the drain of switch S1. In some variations the source and drain of S1 may reversed. A diode D may be connected in series with the secondary coil with of transformer T with the cathode of D connected to one end of the coil. Connected across the series connection of the secondary coil of transformer T and diode D may be capacitor C1. One end of capacitor C1 may be connected to the anode of diode D and the other end of capacitor C1 may be connected to the end of the secondary coil not connected to the diode D. The end of the secondary coil not connected to diode D may also be connected to one end of an inductor L and the other end of inductor L connected to anodes of switch control rectifiers SAC1, SAC2 and one end of capacitor C2. The other end of capacitor C2 may connect to the anode of diode D and the cathodes of switch control rectifiers SAC3 and SAC4. The cathode of switch control rectifier SAC1 may connect to the anode of switch control rectifier SAC3 to form a first terminal of secondary AC output $V_{Grid}$. The cathode of switch control rectifier SAC2 may connect to the anode of switch control rectifier SAC4 to form a second terminal of secondary AC output $V_{Grid}$. Multiple secondary AC outputs ($V_{Grid}$) from multiple inverters 322c may be connected in either series to give a series AC string or in parallel to give a parallel AC string.

Converter circuits 322a, 322b and 322c may having one terminal of respective primary sides ($V_P$) connected to a ground and/or casings 220 of panels 101 which may also be connected to the ground. The ground may be electrical earth and/or a local earth provided in the immediate vicinity of panels 101. Further connections to electrical earth may be made by bonding to casings 220 of panels 101 and framework used to mount panels 101.

Figure 3E:
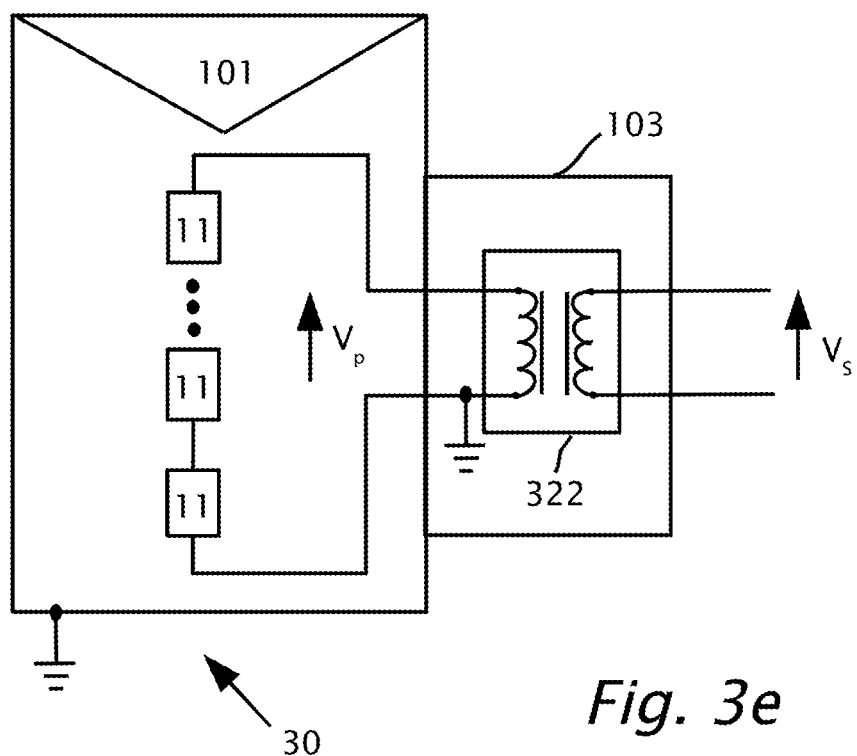
FIG. 3e which shows a photovoltaic module, according to an illustrative embodiment.

Reference is now made to FIG. 3e which shows a photovoltaic module 30, according to an illustrative feature. Photovoltaic module 30 includes one or more panels 101 series connected with sub-strings 11 which are in series and connected across the primary input ($V_P$) of an isolating converter 322. Converter 322 provides a secondary output ($V_S$) which may be galvanically isolated from the primary input ($V_P$). The secondary output ($V_S$) may be DC and/or AC. Circuitry of converter 322 may be integrated or integrable with a photovoltaic panel 101 and/or housed in a junction box 103.

Figure 4:
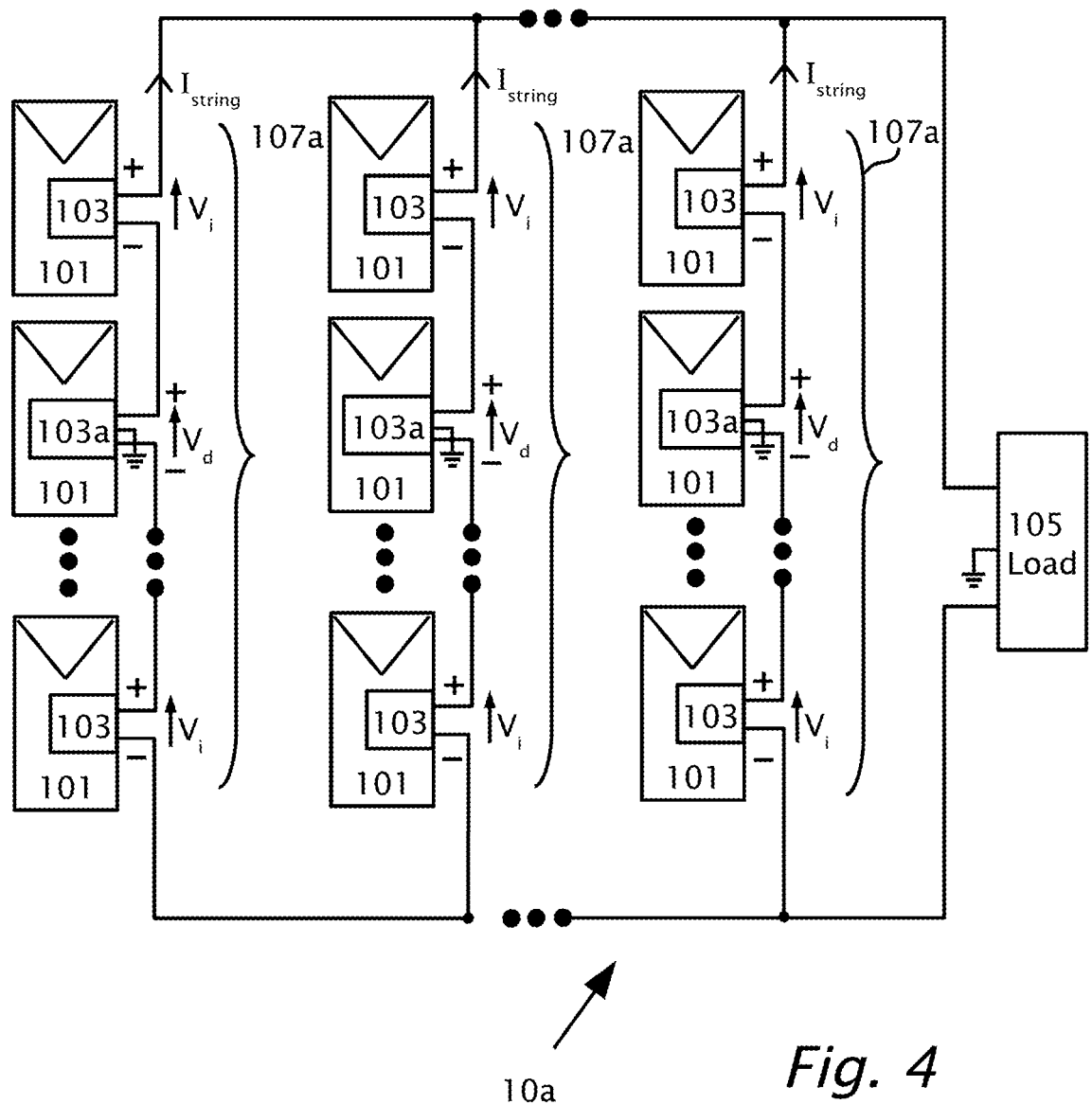
FIG. 4 shows an alternative photovoltaic solar power harvesting system, according to various aspects.
Figure 5:
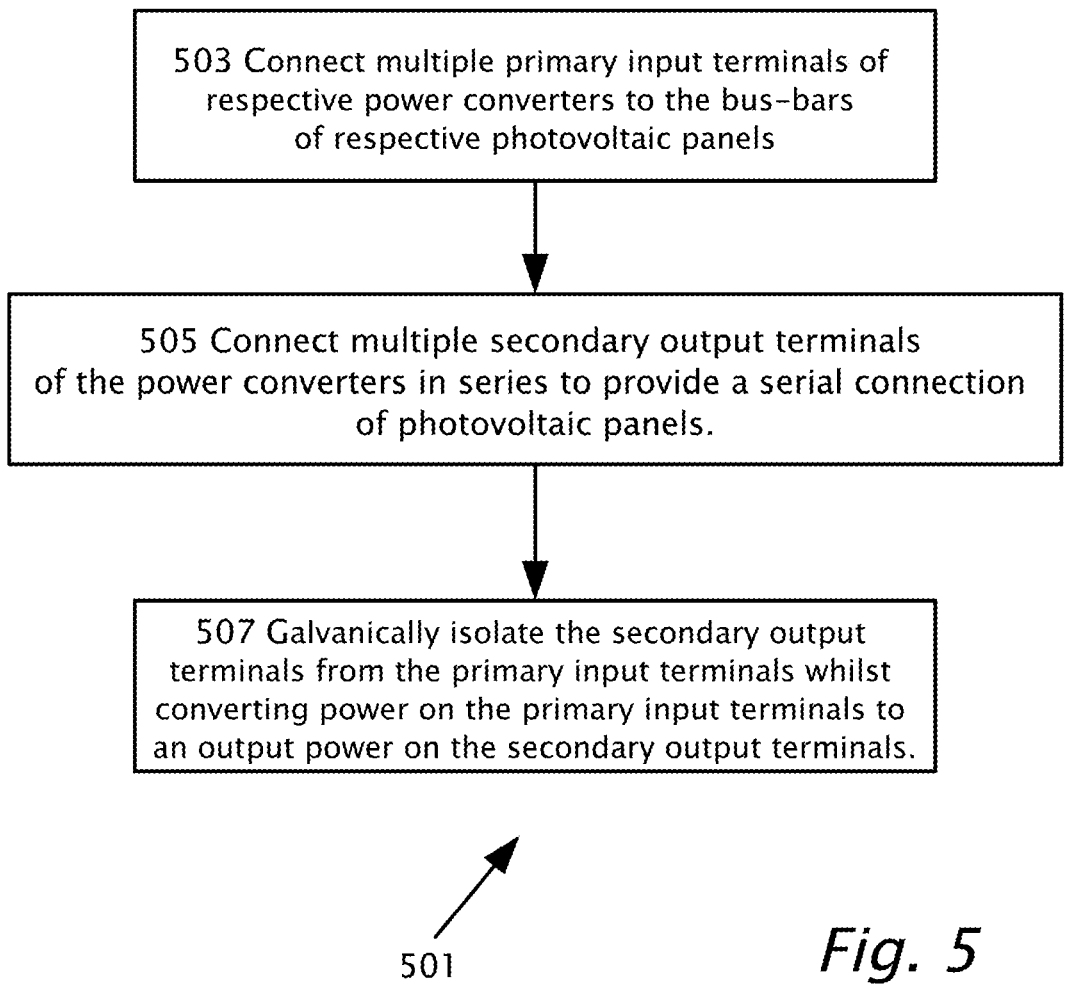
FIG. 5 which shows a method which may be applied to the system and junction boxes shown in FIG. 1, according to an illustrative feature.

Reference is now made to FIG. 5 which shows a method 501 which may be applied to system 10/10a and junction boxes 103, according to an illustrative feature as shown in FIGS. 1 and 4. With reference to FIG. 3a, in step 503, a single primary DC input ($V_P$) of converter 322 is connected to bus-bars a and c via terminations, which may be located in in junction box 103. Where converter 103 has a dual DC input, connection may be made to bus bar b. In the case of dual DC input into converter 322 bus bar b may be additionally connected to a local ground or electrical earth. Similar connections may be made in multiple converters 322 (which may be in respective multiple junction boxes 103) integrated with panels 101. In step 505, the outputs ($V_i$) of converters 322 may be wired in series to form a string 107 illustrated in FIG. 4. During the irradiation of strings 107 if an isolating converter 322 is used, in step 507, DC power on the primary input ($V_P$) may be converted with galvanic isolation to the secondary output ($V_i$). The galvanic isolation between primary input ($V_P$) and secondary output ($V_i$), may additionally allow for different ground potentials on either side of the primary input ($V_P$) and the secondary output ($V_i$). The galvanic isolation of different ground potentials, on either side of 322, may allow for use of various configurations of single or dual DC input and/or outputs on the primary inputs ($V_P$) and the secondary outputs ($V_i$) within string 107, since each $V_P$ may be isolated from every other $V_P$.

By way of numerical example, a comparison may be made between ten panels 101 having converters 322 in a string 107 and ten panels without converters 322 connected in a serial string. In the serial string the first panel 101 has the negative terminal connected to a ground and the chassis of the first panel 101 connected to the ground as well. The remaining nine panels 101 only have their respective chassis connected to the ground. If the output of each panel is 40 Volts, then the top tenth panel 101 has a voltage of 10 times 40V=400 Volts at its positive output terminal and the ninth panel has voltage of 9 times 40=360 Volts at its positive output terminal. By comparison in a string 107 using isolating converters, the primary side of the respective converters 322 have a ground connection as shown in FIG. 3e as well as the chassis of each respective panel 101 being connected to the ground as well. In such a string 107 with isolating converters 322, the primary side and hence the output of each panel 101 is at 40 Volts by virtue of the galvanic isolation between the primary side and the secondary side of each respective converter 322. The secondary sides of converters 322 in series string 107 still give 10 times 40V=400 Volts but each panel 101 in string 107 only operates at 40 Volts with respect to the ground. Therefore, the voltage rating of each panel 101 in a string 107 is only 40 Volts compared to the panels 101 in the serial string of panels 101. Panels 101 in the serial string may have to have a voltage rating of at least 400 Volts if the first panel 101 has the negative terminals connected to the ground and possibly a much greater rating of 400 Volts if the first panel 101 has the negative terminal not connected to the ground. The negative terminal not connected to the ground may allow the voltage of the serial string to float, so that the tenth panel 101 in the serial string may have a voltage greater than 400 Volts.

Figure 6:
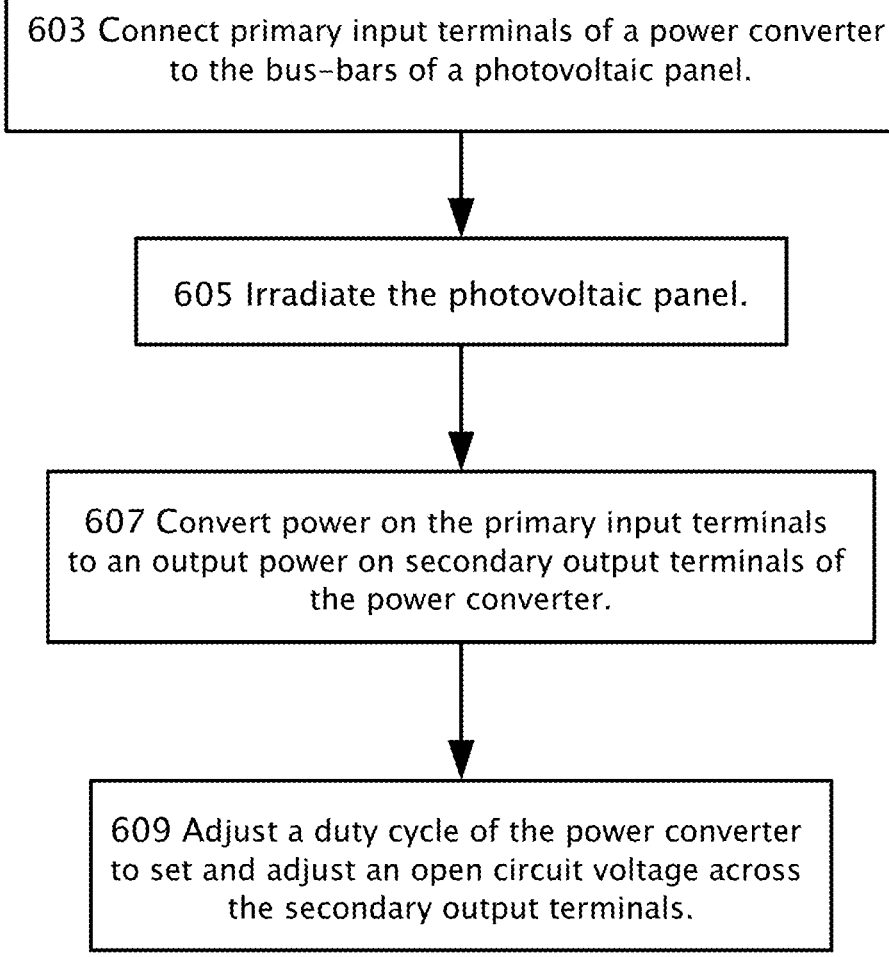
FIG. 6 shows a method according to various embodiments.

Further, as shown in FIG. 4, the series string of secondary outputs of converters 322 may be referenced to ground at various points to provide a reduced maximum voltage with respect to the ground reference of the primary side. For example, a secondary output of an intermediate converter in each string may be grounded, such that converters connected in the string on one side (e.g., the positive side) of the ground point may have a positive voltage with respect to ground, and converters connected in the string on the other side (e.g., the negative side) of the ground point have a negative voltage. In the example above, the 400V across the secondary output string can be referenced to a range of −200V to +200V with respect to the ground reference. Thus, the maximum primary to secondary side voltage difference can be reduced from 400V to 200V. Reference is now made to FIG. 6 which shows a method 601 which may be applied to system 10/10a and a junction box 103, according to an illustrative feature. Method 601 may be applied to junction box and/or panel 101, prior to making a series connection of the outputs ($V_i$) of converters 322 to form a string 107. In step 603, a single primary DC input ($V_P$) of converter 322 is connected to bus-bars a and c via terminations, which may be located in junction box 103. Where converter 103 has a dual DC input, connection may be made to bus bar b. In step 605 a panel 101 may be then irradiated to provide a voltage on the primary input ($V_P$) of converter 322. Alternatively, another DC voltage source may be connected to the primary input ($V_P$) of converter 322. With a panel 101 connected (step 603) to the primary input ($V_P$) and the panel 101 irradiated (step 605) or DC voltage applied to the primary input ($V_P$), DC power on the primary input ($V_P$) may be converted with galvanic isolation to the secondary output ($V_i$). During the conversion of power by converter 322, the duty cycle of converter 322 may be adjusted to vary and set the open circuit voltage on the secondary output ($V_i$) of converter 322 (step 609). Alternatively, the duty cycle of converter may be adjusted to vary and set the operating voltage on the secondary output ($V_i$) of converter 322 when the secondary output ($V_i$) is connected to a load and/or within a string 107.

The indefinite articles "a", "an" is used herein, such as "a photovoltaic panel", "a junction box" have the meaning of "one or more" that is "one or more photovoltaic panels" or "one or more junction boxes".

Aspects of the disclosure have been described in terms of illustrative embodiments thereof. While illustrative systems and methods as described herein embodying various aspects of the present disclosure are shown, it will be understood by those skilled in the art, that the disclosure is not limited to these embodiments. Modifications may be made by those skilled in the art, particularly in light of the foregoing teachings. For example, each of the features of the aforementioned illustrative examples may be utilized alone or in combination or sub combination with elements of the other examples. For example, any of the above described systems and methods or parts thereof may be combined with the other methods and systems or parts thereof described above. For example, one of ordinary skill in the art will appreciate that the steps illustrated in the illustrative figures may be performed in other than the recited order, and that one or more steps illustrated may be optional in accordance with aspects of the disclosure. It will also be appreciated and understood that modifications may be made without departing from the true spirit and scope of the present disclosure. The description is thus to be regarded as illustrative instead of restrictive on the present disclosure.

The invention claimed is:

1. A power harvesting system comprising:
   first and second photovoltaic power sources;
   first and second casings, wherein the first casing supports the first photovoltaic power source, and wherein the second casing supports the second photovoltaic power source; and
   first and second converter circuits, wherein the first converter circuit comprises a first input terminal electrically connected to the first photovoltaic power source, a second input terminal directly shorted to the first casing, and output terminals galvanically isolated from the first and second input terminals of the first converter circuit, wherein the second converter circuit comprises a first input terminal electrically connected to the second photovoltaic power source, a second input terminal directly shorted to the second casing, and output terminals galvanically isolated from the first and second input terminals of the second converter circuit, and wherein the output terminals of the first converter circuit and the output terminals of the second converter circuits are connected in series to form a series string.

2. The power harvesting system of claim 1, further comprising: a load connected across the series string.

3. The power harvesting system of claim 2, wherein the load comprises: a direct current (DC) to alternating current (AC) inverter, a three-level DC to AC inverter, a grid connectable DC to AC inverter, a DC battery, a DC motor, or a DC to DC converter input.

4. The power harvesting system of claim 1, wherein the second input terminal of the first converter circuit is bonded to the first casing and the second input terminal of the second converter circuit is bonded to the second casing.

5. The power harvesting system of claim 1, wherein the second input terminal of the first converter circuit and the second input terminal of the second converter circuit are connected to a common ground connection.

6. The power harvesting system of claim 5, wherein the common ground connection is earth ground.

7. The power harvesting system of claim 5, wherein the series string generates an output voltage with respect to a voltage of a second common ground connection.

8. The power harvesting system of claim 1, further comprising:
   a third photovoltaic power source;
   a third casing supporting the third photovoltaic power source; and
   a third converter circuit comprising a first input terminal electrically connected to the third photovoltaic power source, a second input terminal directly shorted to the third casing, and output terminals galvanically isolated from the first input terminal and the second input terminal of the third converter circuit,
   wherein the third converter circuit is referenced to a ground connection.

9. The power harvesting system of claim 8, wherein the output terminals of the third converter circuit are connected in series between the output terminals of the first converter circuit and second converter circuit;
   wherein the series string comprises first and second string terminals at each end of the series string;
   wherein the first string terminal is configured to output a positive voltage with respect to the ground connections; and
   wherein the second string terminal is configured to output a negative voltage at one of the output terminals of the second converter circuit with respect to the ground connection.

10. The power harvesting system of claim 1, wherein each of the first and second photovoltaic power sources is a photovoltaic panel.

11. The power harvesting system of claim 1, further comprising:
    a first insulating sheet in contact with the first photovoltaic power source; and
    a second insulating sheet in contact with the second photovoltaic power source,
    wherein the first insulating sheet and the second insulating sheet insulate the first and second photovoltaic power sources from the first and second casings, respectively, to an insulation level that withstands a voltage corresponding to a maximum voltage capable of being output by the first and second photovoltaic power sources.

12. The power harvesting system of claim 1, further comprising:
    first and second junction boxes each comprising a plurality of terminals, wherein each of the first and second converter circuits is housed within a respective one of the first and second junction boxes, wherein the first and second input terminals of each of the first and second converter circuits are connected to the plurality of terminals of a respective one of the first and second junction boxes, and wherein the first and second junction boxes are directly attached to a respective one of the first and second photovoltaic power sources.

13. The power harvesting system of claim 1, wherein the first and second casings comprise a conducting material, and are connected to a ground connection.

14. A method comprising:
connecting a first input terminal of a first power converter to a first photovoltaic panel;
connecting a first input terminal of a second power converter to a second photovoltaic panel;
directly shorting a second input terminal of the first power converter to a first casing supporting the first photovoltaic panel;
directly shorting a second input terminal of the second power converter to a second casing supporting the second photovoltaic panel;
connecting output terminals of the first power converter and output terminals of the second power converter in series, wherein the first and second input terminals of the first power converter are galvanically isolated from the output terminals of the first power converter and the first and second input terminals of the second power converter are galvanically isolated from the output terminals of the second power converter; and
connecting the series connected output terminals of the first power converter and the second power converter to an input terminal of a direct current (DC) to alternating current (AC) converter.

15. The method of claim 14, further comprising:
connecting the second input terminal of at least one of the first and second power converters to a common ground.

16. The method of claim 15, further comprising:
connecting a first input terminal of a third power converter to a third photovoltaic panel;
directly shorting a second input terminal of the third power converter to a third casing supporting the third photovoltaic panel;
connecting, via output terminals of the third power converter, the third power converter in series with the first and second power converters such that the second power converter is in an intermediate power converter between the first power converter and the third power converter; and
connecting one of the output terminals of the second power converter to the common ground.

17. The method of claim 14, further comprising:
placing first and second insulating sheets in contact with a respective one of the first and second photovoltaic panels, such that the first and second insulating sheets insulate the first and second photovoltaic panels, respectively, to an insulation level that withstands a voltage corresponding to a maximum voltage capable of being output by the first and second photovoltaic panels.

18. The method of claim 14, further comprising:
housing the first and second power converters within a respective one of first and second junction boxes;
connecting a plurality of terminals of each of the first and second power converters to the first and second input terminals of each of the first and second power converters; and
directly attaching each of the first and second junction boxes to the respective one of the first and second photovoltaic panels.

19. The method of claim 14, wherein each of the first casing and the second casing comprises a conducting material, and
the method further comprises connecting each of the first casing and the second casing to a ground connection.

20. The method of claim 14, wherein directly shorting the second input terminal of the first power converter to the first casing supporting the first photovoltaic panel comprises:
bonding the second input terminal of the first power converter to the first casing, and
wherein directly shorting the second input terminal of the second power converter to the second casing supporting the second photovoltaic panel comprises:
bonding the second input terminal of the second power converter to the second casing.

\* \* \* \* \*